United States Patent
Cites et al.

(10) Patent No.: US 7,927,970 B2
(45) Date of Patent: Apr. 19, 2011

(54) PRODUCING SOI STRUCTURE USING HIGH-PURITY ION SHOWER

(75) Inventors: Jeffrey Scott Cites, Horseheads, NY (US); Kishor Purushottam Gadkaree, Big Flats, NY (US); Richard Orr Maschmeyer, Corning, NY (US)

(73) Assignee: Corning Incorporated, Corning, NY (US)

( * ) Notice: Subject to any disclaimer, the term of this patent is extended or adjusted under 35 U.S.C. 154(b) by 158 days.

(21) Appl. No.: 12/369,485

(22) Filed: Feb. 11, 2009

(65) Prior Publication Data

US 2009/0149001 A1  Jun. 11, 2009

Related U.S. Application Data

(63) Continuation of application No. 11/444,741, filed on May 31, 2006, now Pat. No. 7,608,521.

(51) Int. Cl.
*H01L 21/30* (2006.01)
*H01L 21/46* (2006.01)
*H01L 21/762* (2006.01)

(52) U.S. Cl. .. 438/455; 438/149; 438/458; 257/E21.568
(58) Field of Classification Search .................. 438/149, 438/455, 458; 257/E21.568
See application file for complete search history.

(56) References Cited

U.S. PATENT DOCUMENTS

| | | | |
|---|---|---|---|
| 4,914,292 A | 4/1990 | Tamai et al. | 250/251 |
| 5,189,303 A | 2/1993 | Tanjyo et al. | 250/296 |
| 5,350,926 A | 9/1994 | White et al. | 250/492.21 |
| 5,985,742 A | 11/1999 | Henley et al. | |
| 6,010,579 A | 1/2000 | Henley et al. | |
| 6,027,988 A | 2/2000 | Couillard et al. | |
| 6,155,909 A | 12/2000 | Henley et al. | |
| 6,160,262 A | 12/2000 | Aoki et al. | 250/492.21 |
| 6,162,705 A | 12/2000 | Henley et al. | |
| 6,300,227 B1 | 10/2001 | Liu et al. | |
| 6,344,404 B1 | 2/2002 | Cheung et al. | |
| 6,458,671 B1 | 10/2002 | Liu et al. | |
| 6,458,672 B1 | 10/2002 | Henley et al. | |
| 6,927,148 B2 | 8/2005 | Ito | 438/458 |
| 2002/0064924 A1 | 5/2002 | Cheung et al. | |
| 2002/0100880 A1 | 8/2002 | Chen et al. | |
| 2004/0038504 A1 | 2/2004 | Ito | |
| 2004/0171232 A1 | 9/2004 | Cayrefourcq et al. | |
| 2004/0229444 A1 | 11/2004 | Couillard et al. | |
| 2006/0038227 A1 | 2/2006 | Aitken et al. | |

FOREIGN PATENT DOCUMENTS

JP  11329996  11/1999

OTHER PUBLICATIONS

Phosphorus Ion Shower Implantation For Special Power IC Application, F. Kroner, R. Schork, L. Frey, A. Burenkov and H. Ryssel, IEEE, 2000, pp. 476-479.

*Primary Examiner* — Charles D Garber
*Assistant Examiner* — Stanetta D Isaac
(74) *Attorney, Agent, or Firm* — Bruce P. Watson

(57) ABSTRACT

Disclosed are methods for making SOI and SOG structures using purified ion shower for implanting ions to the donor substrate. The purified ion shower provides expedient, efficient, low-cost and effective ion implantation while minimizing damage to the exfoliation film.

22 Claims, 6 Drawing Sheets

PRODUCING SOI STRUCTURE USING HIGH-PURITY ION SHOWER

CROSS REFERENCE TO RELATED APPLICATIONS

This application is a continuation application of U.S. patent application Ser. No. 11/444,741, filed May 31, 2006, the entire disclosure of which is hereby incorporated by reference.

FIELD OF THE INVENTION

The present invention relates to processes for making semiconductor-on-insulator ("SOI") structures. In particular, the present invention relates to processes for making SOI structures by using high-purity ion shower implantation. The present invention is useful, for example, in the manufacture of semiconductor-on-insulator structures such as silicon-on-insulator structures, semiconductor-on-glass structures such as silicon-on-glass structures, and related semiconductor devices.

BACKGROUND OF THE INVENTION

As used herein, the abbreviation "SiOI" refers to silicon-on-insulator. The abbreviation "SOI" refers to semiconductor-on-insulator in general, including but not limited to SiOI. The abbreviation "SiOG" refers to silicon-on-glass. The abbreviation "SOG" refers to semiconductor-on-glass in general, including but not limited to SiOG. SOG is intended to include semiconductor-on-ceramics and semiconductor-on-glass-ceramics structures. Likewise, SiOG is intended to include silicon-on-ceramics and silicon-on-glass-ceramics structures.

SiOI technology is becoming increasingly important for high performance thin film transistors, solar cells, and displays, such as active matrix displays. The SiOI wafers typically consists of a thin layer of substantially single-crystalline silicon generally 0.1-0.3 microns in thickness but, in some cases, as thick as 5 microns, on an insulating material.

Various ways of obtaining such a SiOI wafer include epitaxial growth of Si on lattice matched substrates; bonding of a single-crystalline wafer to another silicon wafer on which an oxide layer of $SiO_2$ has been grown, followed by polishing or etching of the top wafer down to, for example, a 0.1 to 0.3 micron layer of single-crystalline silicon; or ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation. Of these three approaches, the approaches based on ion implantation have been found to be more practical commercially. In particular, the hydrogen ion implantation method has an advantage over the oxygen implantation process in that the implantation energies required are less than 50% of that of oxygen ion implants and the dosage required is two orders of magnitude lower.

Exfoliation by the hydrogen ion implantation method was initially taught in, for example, Bister et al., "Ranges of the 0.3-2 KeV $H^+$ and 0.2-2 KeV $H_2+$Ions in Si and Ge," Radiation Effects, 1982, 59:199-202, and has been further demonstrated by Michel Bruel. See Bruel, U.S. Pat. No. 5,374,564; M. Bruel, Electronic Lett., 31, 1995, 1201-02; and L. Dicioccio, Y. Letiec, F. Letertre, C. Jaussad and M. Bruel, Electronic Lett., 32, 1996, 1144-45.

The hydrogen ion implantation method typically consists of the following steps. A thermal oxide layer is grown on a single-crystalline silicon wafer. Hydrogen ions are then implanted into this wafer to generate subsurface flaws. The implantation energy determines the depth at which the flaws are to be generated and the dosage determines flaw density. This wafer is then placed into contact with another silicon wafer (the support substrate) at room temperature to form a tentative bond.

The wafers are then heat-treated to about 600° C. to cause growth of the subsurface flaws for use in separating a thin layer of silicon from the Si wafer. The resulting assembly is then heated to a temperature above 1000° C. to fully bond the Si film with $SiO_2$ underlayer to the support substrate, i.e., the un-implanted silicon wafer. This process thus forms a $SiO_2$ structure with a thin film of silicon bonded to another silicon wafer with an oxide insulator layer in between.

Cost is an important consideration for commercial applications of SOI and SiOI structures. To date, a major part of the cost of such structures has been the cost of the silicon wafer which supports the oxide layer, topped by the Si thin film, i.e., a major part of the cost has been the support substrate.

Although the use of quartz as support substrate has been mentioned in various patents (see U.S. Pat. Nos. 6,140,209, 6,211,041, 6,309,950, 6,323,108, 6335,231 and 6,391,740), quartz is itself a relatively expensive material. In discussing support substrates, some of the above-references have mentioned quartz glass, glass, and glass-ceramics. Other support substrate materials listed in these references include diamond, sapphire, silicon carbide, silicon nitride, ceramics, metals, and plastics.

It is not at all a simple matter to replace a silicon wafer with a wafer made out of a less expensive material in an SOI structure. In particular, it is difficult to replace a silicon wafer with a glass or glass-ceramic or ceramic of the type which can be manufactured in large quantities at low cost, i.e., it is difficult to make cost effective SOG and SiOG structures.

Co-pending, co-assigned U.S. patent application Ser. No. 10/779,582, published as US2004/0229444 A1, describes techniques for making SiOG and SOG structures and novel forms of such structures. Among the numerous applications for the invention are those in such fields as optoelectronics, FR electronics, and mixed signal (analog/digital) electronics, as well as display applications, e.g., LCDs and OLEDs, where significantly enhanced performance can be achieved compared to amorphous and polysilicon based devices. In addition, photovoltaics and solar cells with high efficiency were also enabled. Both the processing techniques and its novel SOI structures significantly lower the cost of an SOI structure.

Another factor significantly affecting the cost of ion-implantation approach to producing SOI, SiOI, SOG and SiOG structures is the efficiency of the ion-implantation process. Traditionally, hydrogen ion implantation or oxygen ion implantation were used, with the former being preferred due to the higher efficiency. However, those traditional ion-implantation processes require the use of narrow ion beams, which lead to long implantation time and high cost. As a result, substitute ion sources were developed and disclosed in the prior art.

For example, U.S. Pat. No. 6,027,988 proposes the use of plasma ion immersion implantation ("PIII"), where the semiconductor substrate such as a silicon wafer is placed in a plasma atmosphere and an electric field, thereby enabling large area simultaneous ion implantation. However, PIII suffers from the drawbacks of surface charging and etching by the plasma and lack of flexibility at higher energy, lack of accurate dosage control, and inability to precisely control the thickness of the ion implantation zone and the thickness of the exfoliation film.

Another alternative to narrow area ion beam implantation is ion shower implantation (ISI). An ion shower is typically a large area ion beam extracted from a plasma source by means of an extraction electrode and an optional post-acceleration system. Ion shower differs from PIII in that it uses a remote plasma, a field-free region around the substrate to be ion-implanted, and a continuous instead of a pulsed ion beam. These features of the ISI system eliminates the surface charging and etching problem of PIII, and enables accurate dosage control.

The present inventors have discovered that, while ISI can achieve quick ion implantation, the use of conventional ISI in the production of SOG structures can lead to unacceptable damage of the thin film upon separation thereof from the substrate. For the manufacture of many semiconductor devices, it is important the integrity of the crystalline lattice of the thin film is substantially maintained during the implantation and upon separation thereof from the substrate.

Therefore, there remains a process for separating a thin film of semiconductor material that is efficient, effective, yet without damaging the desired structure of the thin film. In particular, there remains a process for making SOG structures wherein the ion implantation process can be implemented with efficiency and efficacy.

The present invention satisfies this long-standing need.

SUMMARY OF THE INVENTION

According to a first aspect of the present invention, it is provided a process for forming a SOI structure comprising the following steps:

providing a donor substrate comprising semiconductor material having a first donor external surface; and implanting a plurality of ions belonging to a first species through the first donor external surface into an ion implantation zone at a depth below the first donor external surface by using a first ion shower purified by electromagnetic separation such that the structure of at least a 50 nm thick part, in certain embodiments at least a 100 nm thick part, in certain embodiments at least a 150 nm thick part, in certain embodiments at least a 200 nm thick part, of the film of material sandwiched between the ion implantation zone and the first donor external surface ("exfoliation film") is essentially not damaged.

In certain embodiments of this process of the present invention, the exfoliation film comprises single-crystalline silicon.

In certain embodiments of the process of the first aspect of the present invention, in step (II), the depth of the ion implantation zone is less than about 1000 nm, in certain embodiments less than about 500 nm, in certain other embodiments less than about 300 nm, in certain other embodiments less than about 150 nm, in certain other embodiments less than about 100 nm. In certain embodiments of this process, the thickness of the non-damaged part of the exfoliation film is at least a majority of (50%) of the total thickness of the exfoliation film, in certain embodiments at least 60%, in certain embodiments at least 80%, in certain embodiments at least 90%.

In certain embodiments of this process of the present invention, in step (II), the ion implantation zone has a thickness of not larger than about 1 μm, in certain embodiments not larger than about 500 nm, in certain other embodiments not larger than about 300 nm, in certain other embodiments not larger than about 200 nm.

In certain embodiments of this process of the present invention, in step (II), the first ion shower consists essentially of the ions belonging to a first species. In certain embodiments, the ions belonging to the first species is a single ion species selected from $H_3^+$, $H^+$, $H_2^+$, $D_2^+$, $D_3^+$, $HD^+$, $H_2^+$, $HD_2^+$, $He^+$, $He^{2+}$, $O^+$, $O_2^+$ $O_2^+$ and $O_3^+$. In certain embodiments, the ions belonging to the first species are essentially free of phosphorous, boron, arsenic, carbon, nitrogen, oxygen, fluorine, chlorine and metals.

Certain embodiments of this process of the present invention further comprise the following step (III) separate of and independent from step (II):

implanting a plurality of ions belonging to a second species through the first donor external surface into the ion implantation zone at the depth below the first donor external surface by using a second ion shower purified by electromagnetic separation such that the structure of at least a 50 nm thick part, in certain embodiments at least a 100 nm thick part, in certain other embodiments at least a 150 nm thick part, in certain embodiments at least a 200 nm thick part, of the exfoliation film is essentially not damaged, said ions belonging to the second species being different from the ions belonging to the first species.

According to certain embodiments of the first aspect of the present invention, the ion implantation zone comprises a first ion implantation zone where the ions belonging to the first ion species are implanted and a second ion implantation zone where the ions belonging the second ion species are implanted, and the first ion implantation zone and the second ion implantation zone substantially overlap. In certain embodiments, the distance between the peak of the ion species are less than about 200 nm, in certain embodiments less than about 150 nm, in certain embodiments less than about 100 nm, in certain embodiments less than about 50 nm.

In certain particular embodiments of this process of the present invention, the ions belonging to the first species are $H_3^+$, and the ions belonging to the second species are $He^+$. In certain embodiments, the ratio of the energy of $H_3^+$ ions to that of the $He^+$ ions is about 2:1. In certain particular embodiments of this process, the $H_3^+$ has an energy of about 60 KeV, and the $He^+$ has an energy of about 30 KeV. In certain advantageous embodiments, the $H_3^+$ implantation zone and the $He^+$ implantation zone, both within the ion implantation zone of the donor substrate, overlap substantially.

In certain embodiments of the process according to the first aspect of the present invention, it further comprises a step (IIIA) separate from and independent of step (II) as follows:

(IIIA) implanting a plurality of ions through the first donor external surface into the ion implantation zone at the depth below the first donor external surface by using a beam-line implanter.

In certain embodiments of the process according to the first aspect of the present invention, it further comprises a step (IIIB) separate from and independent of step (II) as follows:

(IIIB) implanting a plurality of ions through the first donor external surface into the ion implantation zone at the depth below the first donor external surface by using a conventional ion shower.

Certain embodiments of the process of the first aspect of the present invention comprises the following step (IV):

bonding the first donor external surface to a recipient substrate.

Certain other embodiments of the process of the first aspect of the present invention comprises the following step (V):

separating at least part of the exfoliation film and at least part of the material in the implantation zone at a location within the implantation zone.

Certain embodiments of the process of the first aspect of the present invention comprises the following (IV) and (V):

(IV) bonding the first donor external surface to a recipient substrate; and separating the exfoliation film and at least part of the material in the separation zone at a location within the implantation zone.

According to certain embodiments of the first aspect of the present invention wherein the donor substrate is bonded to a recipient substrate as described above, the recipient substrate is selected from the group consisting of: a semiconductor wafer with or without an oxide surface layer; a glass plate; and a glass-ceramic plate.

According to certain embodiments of the first aspect of the present invention wherein the donor substrate is bonded to a recipient substrate as described above, the recipient substrate is a silicon wafer with a $SiO_2$ surface layer, and the first donor external surface of is bonded to the $SiO_2$ surface layer in step (IV).

According to certain embodiments of the first aspect of the present invention wherein the donor substrate is bonded to a recipient substrate as described above, the recipient substrate is a $SiO_2$ glass plate.

According to certain embodiments of the first aspect of the present invention wherein the donor substrate is bonded to a recipient substrate as described above:

the recipient substrate comprises oxide glass or oxide glass-ceramic; and in step (IV), the bonding is effected by applying (a) forces to the donor and recipient substrates such that they are pressed into close contact; (b) electric field within the donor and recipient substrates such that the electrical potential in the donor substrate is higher than that in the recipient substrate; and (c) a temperature gradient between the donor and recipient substrates.

According to certain embodiments of the first aspect of the present invention, in step (II), the electromagnetic separation of the first ion shower is effected by magnetic means.

A second aspect of the present invention is a process for forming a SOI structure comprising the following steps:

(A1) providing a donor substrate and a recipient substrate, wherein:

the donor substrate comprises a semiconductor material and a first donor external surface for bonding with the recipient substrate (first bonding surface) and a second donor external surface;

the recipient substrate comprises an oxide glass or oxide glass-ceramic and two external surfaces: (i) a first recipient external surface for bonding to the first substrate (the second bonding surface); and (ii) a second recipient external surface;

(A2) implanting a plurality of ions belonging to a first species through the first donor external surface into an ion implantation zone of the donor substrate at a depth below the first donor external surface by using a first ion shower purified by electromagnetic separation such that the internal structure of at least a 50 nm thick part, in certain embodiments at least a 100 nm thick part, in certain embodiments at least a 150 nm part, in certain embodiments at least a 200 nm thick part, of the film of material sandwiched between the implantation zone and at least a majority of the first donor external surface ("exfoliation film") is essentially not damaged;

(B) after steps (A1) and (A2), bringing the first and second bonding surfaces into contact;

(C) for a period of time sufficient for the donor and recipient substrates to bond to one another at the first and second bonding surfaces, simultaneously:

(1) applying forces to the donor substrate and/or the recipient substrate such that the first and second bonding surfaces are pressed into contact;

(2) subjecting the donor and recipient substrates to an electric field having a general direction of from the second recipient external surface to the second donor external surface; and (3) heating the donor and recipient substrates, said heating being characterized in that the second donor and recipient external surfaces have average temperatures $T_1$ and $T_2$, respectively, said temperatures being selected such that upon cooling to a common temperature, the donor and recipient substrates undergo differential contraction to thereby weaken the donor substrate at the ion implantation zone; and (D) cooling the bonded donor and recipient substrates and splitting the donor substrate at the ion implantation zone;

wherein the oxide glass or oxide glass-ceramic comprises positive ions which during step (C) move within the recipient substrate in a direction away from the second bonding surface and towards the second recipient external surface.

In certain embodiments of the second aspect of the present invention, the exfoliation film comprises single-crystalline semiconductor material.

In certain embodiments of the process of the second aspect of the present invention, in step (A2), the depth of the ion implantation zone is less than about 1000 nm, in certain embodiments less than about 500 nm, in certain other embodiments less than about 300 nm, in certain other embodiments less than about 150 nm, in certain other embodiments less than about 100 nm. In certain embodiments of this process, the thickness of the non-damaged part of the exfoliation film is at least 50% of the total thickness of the exfoliation film, in certain embodiments at least 60% of the total thickness of the exfoliation film, in certain embodiments at least 80% of the total thickness of the exfoliation film, in certain embodiments at least 90%.

In certain embodiments of the second aspect of the present invention, the exfoliation film comprises single-crystalline silicon.

In certain embodiments of the second aspect of the present invention, in step (A2), the ion implantation zone has a thickness of not larger than about 1 μm, in certain embodiments not larger than about 500 nm, in certain other embodiments not larger than about 300 nm, in certain other embodiments not larger than about 200 nm.

In certain embodiments of the second aspect of the present invention, in step (A2), the first ion shower consists essentially of the ions belonging to a first species.

In certain embodiments of the second aspect of the present invention, the ions belonging to the first species is a single ion species selected from $H_3^+$, $H^+$, $H_2^+$, $D_2^+$, $D_3^+$, $HD^+$, $H_2D^+$, $HD_2^+$, $He^+$, $He^{2+}$.

In certain embodiments of the second aspect of the present invention, the ions belonging to the first species are essentially free of phosphorous, boron, arsenic, carbon, nitrogen, oxygen, fluorine, chlorine and metals.

Certain embodiments of the second aspect of the present invention comprises the following step (A3) separate of and independent from step (A2):

(A3) implanting a plurality of ions belonging to a second species through the first donor external surface into the ion implantation zone at the depth below the first donor external surface by using a second ion shower purified by electromagnetic separation such that the structure of at least a 50 nm thick part, in certain embodiments at least a 100 nm thick part, in certain embodiments at least a 150 nm thick part, in certain embodiments at least a 200 nm thick part, of the exfoliation film is essentially not damaged, said ions belonging to the second species being different from the ions belonging to the first species.

According to certain embodiments of the second aspect of the present invention, the ion implantation zone comprises a first ion implantation zone where the ions belonging to the first ion species are implanted and a second ion implantation zone where the ions belonging the second ion species are implanted, and the first ion implantation zone and the second ion implantation zone substantially overlap. In certain embodiments, the distance between the peaks of the first and second species of ions is less than about 200 nm, in certain embodiments less than about 150 nm, in certain embodiments less than about 100 nm, in certain embodiments less than about 50 nm.

In certain embodiments, the ions belonging to the first species are $H_3^+$, and the ions belonging to the second species are $He^+$. The energy of the $H_3^+$ and $He^+$ are chosen such that upon implantation, they distribute essentially in the ion implantation zone. In certain embodiments, the ratio of the energy of the $H_3^+$ ions to that of the $He^+$ ions are about 2:1. For example, the $H_3^+$ may have an average energy of about 60 KeV, and the $He^+$ may have an average energy of about 30 KeV. In certain advantageous embodiments, the $H_3^+$ ions are implanted in a $H_3^+$ ion implantation zone, the $He^+$ ions are implanted in a $He^+$ ion implantation zone, both the $H_3^+$ and $He^+$ ion implantation zones are within the ion implantation zone of the donor substrate, and they overlap substantially.

In certain embodiments of the second aspect of the present invention, in step (A2), the electromagnetic separation of the first ion-shower is effected by magnetic means.

In certain embodiments of the second aspect of the present invention, the first bonding surface (the first donor external surface) is treated to reduce the hydrogen concentration after ion implantation but before it is brought into contact with the first recipient external surface (second bonding surface) for bonding. Such hydrogen-concentration-reducing means may be selected from oxygen plasma treatment, ozone treatment, $H_2O_2$ treatment, $H_2O_2$ and ammonia treatment, $H_2O_2$ and acid treatment, and combinations thereof.

In certain embodiments of the process of the second aspect of the present invention, at the end of the process, the bond strength between the recipient substrate and the exfoliation film is at least 8 joules/cm², in certain embodiments at least 10 joules/cm², in certain other embodiments at least 15 joules/cm².

In certain embodiments of the process of the second aspect of the present invention, wherein in step (A2), the electromagnetic separation of the first ion shower is effected by magnetic means.

In certain embodiments of the process according to the second aspect of the present invention, it further comprises a step (A3.1) separate from and independent of step (A2) as follows:

(A3.1) implanting a plurality of ions through the first donor external surface into the ion implantation zone at the depth below the first donor external surface by using a beam-line implanter.

In certain embodiments of the process according to the second aspect of the present invention, it further comprises a step (A3.2) separate from and independent of step (A2) as follows:

(A3.2) implanting a plurality of ions through the first donor external surface into the ion implantation zone at the depth below the first donor external surface by using a conventional ion shower.

The present invention has the advantages of the traditional non-mass-separated ion shower ion implantation technique in that it is capable of large area simultaneous ion implantation, low or no surface etch, high efficiency and low cost. By using purified ion shower, the present invention further avoids the damage and contamination that can be caused by the traditional non-mass-separated ion shower to the implanted semiconductor material. Therefore, the present invention enables expedient, efficient and effective ion implantation that is suitable for the production of various SOI structures, including but not limited to SiOI structures, particularly SOG structures, including but not limited to SiOG structures.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification.

BRIEF DESCRIPTION OF THE DRAWINGS

In the accompanying drawings.

DETAILED DESCRIPTION OF THE INVENTION

Figure 1:
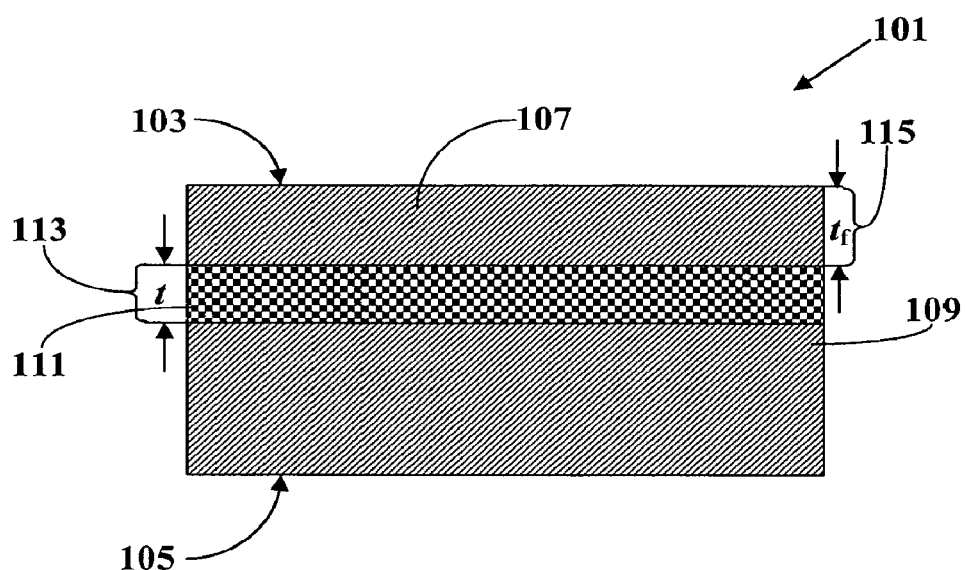
FIG. 1 is a schematic illustration of an embodiment of a donor substrate ion-implanted using the process of the present invention.

As used herein, the term "semiconductor material" means a material, with or without additional modification such as doping, exhibits semiconductive properties. Thus, for example, the semiconductor material in the meaning of the present invention may be a pure single-crystalline silicon, or silicon doped with phosphorous, boron, arsenic or other elements. The semiconductor material is typically in the form of a substantially single-crystalline material. The word "substantially" is used in describing material to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

As used herein, term "first ion implantation zone" means a zone in the donor substrate which, upon implantation, has the peak local density of the implanted ions belonging to the first ion species in terms of number of ions per unit of volume located in the middle thereof, and comprises at least 50% of the implanted ions belonging to the first species. The term "second ion implantation zone" means a zone in the donor substrate which, upon implantation, has the peak local density of the implanted ions belonging to the second ion species in terms of number of ions per unit of volume located in the middle thereof, and comprises at least 50% of the implanted ions belonging to the second species. By "substantially overlapping," it is meant that the first ion implantation zone and the second ion implantation zone have an overlap of at least 50%. For a donor substrate ion-implanted with a single species of ions, the ion implantation zone of the overall substrate is the first ion implantation zone. For a donor substrate ion-implanted with a first and a second species, and even more species of ions, the ion implantation zone of the overall substrate is the combination of the first ion implantation zone, the second ion implantation zone and additional ion implantation zones, if any. The overall ion implantation zone can be predetermined by one skilled in the art in light of the teachings of the present application.

In the present application, a species of ions has a specific mass and charge. Thus any ion with either a differing mass or change is a different species. For example, $H^+$, $H_2^+$, $H_3^+$, $D^+$, $D_2^+$, $D_3^+$, $HD^+$, $H_2D^+$, $HD_2^+$, $He^+$, $He^{2+}$ are all different species of ions in the present application.

Electromagnetic separation in the present application means separation of the different species of ions by means of subjecting the ions to electric and/or magnetic field(s).

The present invention can be applied to the production of any SOI structures. The following detailed description of the present invention uses the production of SiOI for illustration purpose. It should be understood that the present invention is not limited to the production of SiOI structures.

The present invention can be applied to the production of any SOG structures. The following detailed description of the present invention uses the production of SiOG for illustration purpose. It should be understood, however, that the present invention is not limited to the production of SiOG structures. Production of SiOG by using the method of the present invention constitutes one aspect of the present invention. Co-pending, co-assigned U.S. patent application Ser. No. 10/779,582, now published as US 2004/0229444 A1, describes means for making SOG structures, particularly SiOG structures, and novel forms of such structures, the disclosure of which is incorporated herein by reference in its entirety.

Ion implantation is one of the most expensive steps in the production of SOI structures. In SOG structures, the use of inexpensive substrate materials, such as glass and glass-ceramic materials, can reduce the overall cost of the SOG significantly. In the manufacture of SOG structures, as is disclosed in US 2004/0229444 A1, hydrogen ion implantation can be used to separate a thin film semiconductor material such as single-crystalline silicon from a donor substrate. Traditional beam-line ion implantation method and equipment may be used for this purpose. However, the use of traditional beam-line ion implantation equipment is very expensive. In fact, such film separation process generally requires large doses of hydrogen ions. For beam-line implanters, it often takes a long time to achieve the desired level of implantation. This significantly increases the manufacture cost of the SOG structures. Moreover, the use of beam ion hydrogen implantation typically results in a film separated from the donor substrate and bonded to the recipient wafer that is thicker than desired. Further post-treatment, including thinning and polishing of the thick film is required for many intended applications, adding to the overall process complexity, lowering productivity and yield, hence increasing the cost of end product.

As discussed supra, alternative ion implantation method and equipment were proposed in the prior art to replace beam-line ion implantation. U.S. Pat. No. 6,027,988, the relevant portion thereof is incorporated herein by reference, discloses the use of plasma immersion ion implantation (PIII) for that purpose. In the PIII method, a plasma is generated, the recipient wafer is placed inside the plasma and electric field, such that a plurality of ions are accelerated by the electric field and implanted into the donor substrate. This method suffers from surface etch of the donor substrate and difficulty in dosage control. In addition, because multiple species of ions are generated and present in the plasma, and the ions when implanted tend to have wide distribution of energy levels, the implantation depth, hence the thickness of the film to be separated is difficult to control. Still further, detrimental contaminant ions in the plasma may be implanted into the donor substrate, leading to undesired doping and even damage of the film to be separated.

Figure 3:
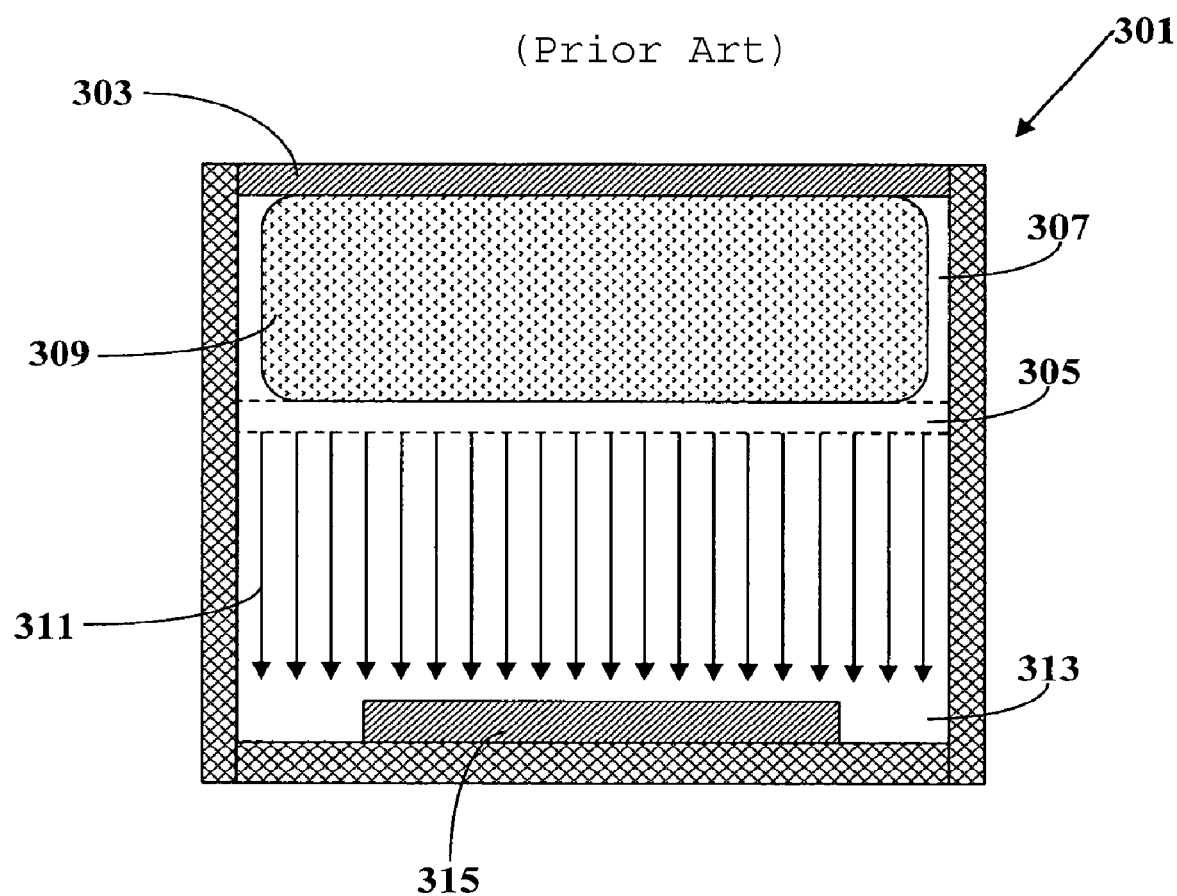
FIG. 3 is a schematic illustration of a conventional non-mass-separated ion shower apparatus being used for ion-implanting a substrate.

Ion shower is also mentioned in U.S. Pat. No. 6,027,988 as a non-mass-separated ion implantation method, the relevant portion thereof is incorporated herein by reference. However, this reference does not have detailed description of ion shower, nor does it provide any concrete example of using ion shower for ion implantation. Ion shower implantation (ISI) uses a large area ion beam derived from a plasma source by using, for example, an extraction electrode. The ions may be accelerated before implantation. Typical use of ion shower for ion implantation is described, for example, in F. Kröner et al., *Phosphorus Ion Shower Implantation for Special Power IC Applications*, Ion Implantation Technology (2000), 476-79, the relevant portion thereof is incorporated herein by reference. FIG. 3 schematically illustrates the use of a conventional ion shower for ion implantation. In the equipment 301, there are two separate chambers: a plasma chamber 307 containing a plasma 309 between electrode 303 and electrode grid 305; and an implantation chamber 313 in which a wafer 315 is placed. The ions 311, optionally further accelerated, travel and partly enter into wafer 315. Thus clearly, the conventional ion shower has the following characteristics: (i) the use of a remote plasma generated in a separate plasma chamber; (ii) the wafer for implantation is not placed in an electric field; and (iii) unlike PIII, the ion source is continuous but not pulsed; and (iv) the ions are not mass-separated, thus the ions that impinge on the wafer to be implanted actually contain a plurality of species with various mass, charges and energy.

Ion shower has been used in the implantation of large ions, such as phosphorous and the like, into semiconductor materials, for the purposes such as doping. However, it is unclear to the present inventors from the prior art whether it can be used successfully for splitting a thin film from a donor semiconductor wafer due to the scant disclosure thereof in references such as U.S. Pat. No. 6,027,988. Moreover, the present inventors have discovered that replacing the beam line ion implantation equipment and process used in the prior art in the manufacture of semiconductor devices such as integrated circuits with ion shower is not as simple and easy as it seems. Substantial technical challenges were encountered.

As described infra, the present inventors have discovered that, by using non-mass-separated ion shower, damage to the crystalline structure of the exfoliation film can be caused. The damage can be so severe that they cannot be used for the manufacture of a lot of microelectronic structures, such as the circuit features of integrated circuits, thus are highly undesirable.

Without intending to be bound by any particular theory, the present inventors believe that the damage to the crystalline structure of the exfoliation film is caused by impurities in the conventional ion shower. In the ion beam of a conventional ion shower, in the plasma chamber, a plurality of ions having differing mass and charges are simultaneously generated, and allowed to impinge on the donor substrate and implanted therein. For example, where hydrogen ion shower is used, in the hydrogen plasma, a plurality of ions belong to differing species, such as $H^+$, $H_2^+$ and $H_3^+$ are produced at various proportions. Due to different sizes and mass, these ions travel at different distances in the donor substrate. Some of them would not reach the ion implantation zone but are implanted in the exfoliation film, causing undesired modification and damage. Moreover, the plasma may further comprise ions such as P+, B+, oxygen ions, carbon ions, fluorine ions and chlorine ions and metals ions due to contamination of the plasma chamber. These large and heavy ions would more than likely retain in the exfoliation film and cause damage.

Therefore, the present inventors made the present invention to solve the associated problems of the prior art methods such as PIII and beam line ion implantation, as well as the drawback of conventional ion shower implantation.

The first aspect of the present invention is thus a process for making SOI structures at large comprising the following steps:

(I) providing a donor substrate comprising semiconductor material having a first donor external surface; and (II) implanting a plurality of ions belonging to a first species through the first donor external surface into an ion implantation zone at a depth below the first donor external surface by using a first ion shower purified by electromagnetic separation such that the structure of at least a 50 nm part, in certain embodiments at least a 100 nm thick part, in certain embodiments at least a 150 nm part, in certain embodiments at least a 200 nm thick part, of the film of material sandwiched between the ion implantation zone and the first donor external surface ("exfoliation film") is essentially not damaged.

As mentioned above, in step (I), the donor substrate may be comprised of any semiconductor material, such as the silicon-based semiconductor materials and non-silicon-based semiconductor materials. The semiconductor material may be essentially pure and single-crystalline, or be previously doped with desired dopants to modify the structure and electric conductivity thereof. In the current semiconductor industry, the most widely used donor substrate is based on single-crystalline silicon, and the most widely produced structure is SiOI structures, such as silicon on oxidized silicon wafers. The present invention can be advantageously applied to such processes to reduce the cost thereof.

In typical semiconductor processes, the donor substrate used have precision polished, highly flat and smooth surfaces. In many situations, the donor substrates are wafers having essentially parallel major surfaces. The present invention may be applied in those situations. However, it is also understood that the donor substrate may have a contoured surface, or even more than one contoured surfaces depending on the surface topography of a recipient substrate to receive the exfoliation film or the intended use of the SOI structure to be produced. It is also possible that the donor substrate has external surfaces characterized by grooves and other features. The use of purified ion-shower according to the process of the present invention may be applied to those donor substrates.

One of ordinary skill in the art knows the desired depth of the ion implantation zone in the donor substrate according to the intended use of the SOI structure and in light of the teachings of the present application. The depth of the ion implantation zone below the first donor external surface determines the thickness of the exfoliation film. Typically, for the purpose of producing a exfoliation film from the donor substrate, the depth of the ion implantation zone is less than about 1000 nm, in certain embodiments less than about 500 nm, in certain embodiments less than about 300 nm, in certain embodiments less than about 150 nm, in certain embodiments less than about 100 nm. Generally, using ion shower, especially the mass-separated ion shower according to the present invention can result in shallower depth of the ion implantation zone, thus a thinner exfoliation film, than using the beam line ion implantation of the prior art, thus reducing down-stream thinning of the exfoliation film. By varying the kinetic energy of the implanting ions, one can change the depth of the ion implantation zone. For example, when implanting single-crystalline silicon donor substrates with $H_3^+$ ions, the energy of the ions may be chosen within the range of about 40 to 70 KeV to obtain a desired thickness of the exfoliation film.

As mentioned supra, in order for the ions to be implanted into the ion implantation zone, it is highly desired that the ions comprised in the ion shower are pure. Thus, the ions belonging to a first species, such as $H^+$, $H_2^+$, $H_3^+$, $He^+$, $He^{2+}$, and the like, desirably have a purity of a at least 90% by mole, in certain embodiments at least 95% by mole, in certain embodiments at least 99% by mole, in certain embodiments preferably at least 99.5%, in certain embodiments preferably at least 99.9%, in certain embodiments at least 99.99%.

It is known that ions with differing mass and charges can be separated by allowing them to travel through an intersecting electric and/or magnetic field. The travel paths of the ions will be altered by the Lorentz force to different degrees depending on their respective mass and charges according to the following equation:

$$\vec{F} = q(\vec{E} + \vec{v} \times \vec{B})$$

where $\vec{F}$ is the Lorentz force vector; $\vec{E}$ is the electric field intensity vector; $\vec{v}$ is the instantaneous velocity vector; $\vec{B}$ is the magnetic field intensity vector; and q is the electric charge of the ion. Thus the Lorentz force has two split elements: the electric force element, and the magnetic force element. The magnetic force is perpendicular to the direction of vector $\vec{B}$ according to the right-hand rule. One skilled in the art, in the light of the disclosure herein, will be able to determine the desired magnetic field $\vec{B}$ used in isolating the individual ion species produced in the ion shower, selecting the desired ones and directing them to the surface of the donor substrate, and filtering out or directing away the undesired and contaminant ions.

Figure 4:
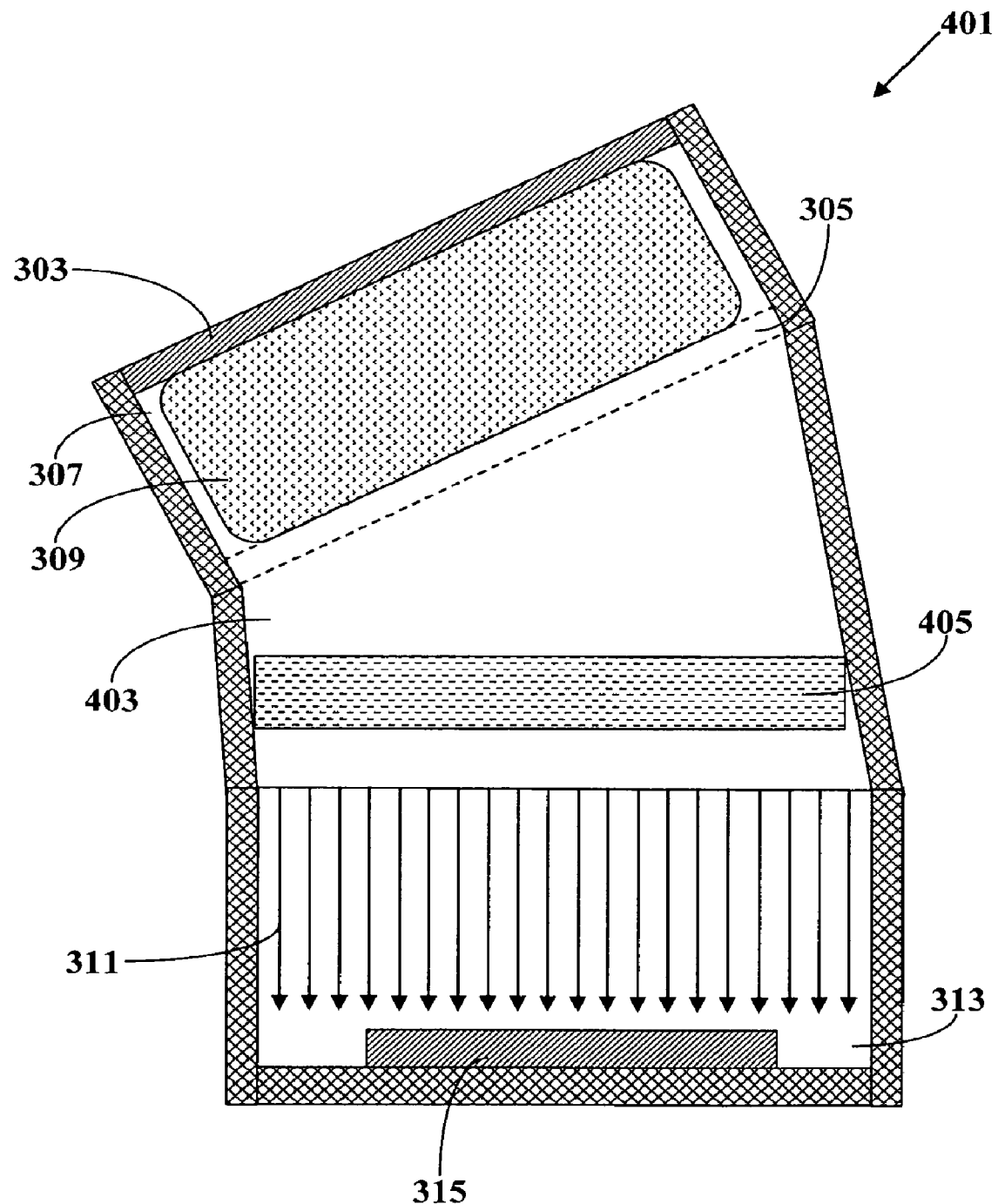
FIG. 4 is a schematic illustration of an apparatus using the process of the present invention for ion-implanting a substrate where the ion shower is purified by a magnetic means.

FIG. 4 schematically illustrates the apparatus set-up for the process of the present invention. Thus, compared to FIG. 3 which schematically illustrates the conventional ion shower, a magnetic analyzer 403 is placed in between the plasma chamber 307 and the implantation chamber 313. A magnetic field 405 is applied in the analyzer 403, which separates the different species of ions according to their respective mass and charges. The thus purified ions of the desired species are directed into the implantation chamber and used for implantation purpose.

In general, when ion showers are used as the ion sources, including conventional ion showers and the mass-separated ion showers according to the present invention, the donor substrate to be ion-implanted is not placed in an electric field. However, in certain situations, it may be desired that that the ions, upon exiting the grid electrode, or upon separation in the electromagnetic analyzer, may need to be accelerated or decelerated so that the ions have the desired energy levels for implanting into the depth. This can be achieved by subjecting to the ions to additional accelerating/decelerating electric field. The donor substrate may be placed inside or outside of the accelerating/decelerating electric field.

Thus, the process according to the first aspect enables ion implantation with high purity ions essentially free of damaging species and having a narrow range of energy levels. This, in turn, enables the precise control of the depth and thickness of the ion implantation zone, which is highly desirable in the manufacture of SOI structures.

FIG. 1 illustrates schematically an embodiment of a donor substrate 101 implanted by using process of the present invention involving mass-separated ion shower according to the present invention. 103 is the first donor external surface, 105 is the second donor external surface, and 113 is the ion implantation zone in which a plurality of ions, such as $H_3^+$ or $He^+$ are implanted. The film of material 115 sandwiched between the ion implantation zone 113 and the first donor external surface 103 is the exfoliation film. 109 in this figure represents the zone immediately below the in implantation zone 113. The ion implantation zone 113 has a thickness of t, and a depth under the first donor external surface of $t_f$. The $t_f$ is also the thickness of the intended exfoliation film 115.

As discussed supra, in a single ion implantation operation, multiple species of ions present in the ion beam is generally undesirable. However, ion implantation using multiple ions may be desirable in the manufacture of certain SOI structures. The present inventors have discovered that, in the manufacture of certain SOG structures, ion implantation using multiple ion species may actually lower the total amount of implanted ions needed to achieve the desired exfoliation and enhance the efficiency of the overall implantation process. According to the present invention, such implantation of multiple ion species can be achieved by, e.g., upon completion of implanting a first species of ions into the ion implantation zone, implementing a second step of ion implantation as follows:

(III) implanting a plurality of ions belonging to a second species through the first donor external surface into the ion implantation zone at the depth below the first donor external surface by using a second ion shower purified by electromagnetic separation such that the structure of the exfoliation film of material is essentially not damaged, said ions belonging to the second species being different from the ions belonging to the first species.

The first ion implantation zone and second ion implantation zone may differ slightly within the donor substrate. However, due to the controllability of the process of the present invention as discussed supra, one skilled in the art in the light of teachings of the present application can choose the proper process parameters such that both of them are located within the ion implantation zone. Indeed, both of them can be controlled such that they substantially overlap. Generally, it is desired that $D_p \leqq 300$ nm, where $D_p$ is the distance between the peak of the ions belonging to the first species in the first ion implantation zone and the peak of the ions belonging to the second species in the second ion implantation zone, in the donor substrate. In certain embodiments it is preferred that $D_p \leqq 200$ nm, in certain other embodiments, $D_p \leqq 100$ nm. In certain embodiments, $D_p \leqq 50$ nm.

Figure 2:
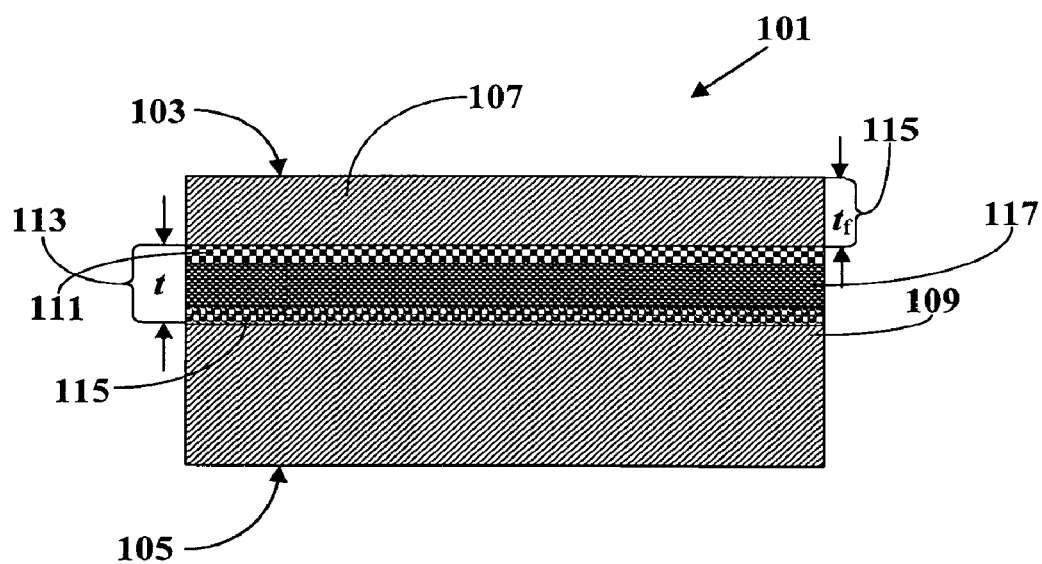
FIG. 2 is a schematic illustration of another embodiment of a donor substrate ion-implanted using the process of the present invention.

FIG. 2 schematically illustrates an implanted donor substrate 201 ion-implanted with two species of ions. In the overall ion implantation zone 113, there are two substantially overlapping zones: the first ion implantation zone 111 and the second ion implantation zone 115. In a particular embodiment of the process according to the first aspect of the present invention, $H_3^+$ and $He^+$ are used as the first and second species of ions for implantation, or vice versa. The order of implanting $H_3^+$ or $He^+$ first or second is not critical, though in certain embodiments it is desired that $H_3^+$ ions are implanted first. This combination of $H_3^+$ and $He^+$ according to the present invention is particularly useful and advantageous for implanting and exfoliating a silicon donor substrate. When implanting single-crystalline silicon substrate, to reach the same ion implantation zone for both $H_3^+$ and $He^+$, the energy needed for the $He^+$ is smaller. The present inventors have discovered that by using (i) ion implantation of $H_3^+$ ions only or (ii) a combination of $H_3^+$ and $He^+$ ion implantation, exfoliation of silicon film can be successfully achieved. However, due to the lower total energy and higher efficiency of (ii), it is preferred over (i). In one particular embodiment of (ii), the energy of $H_2^+$ ions was about 70 KeV, and the energy of $He^+$ was about 40 KeV, which resulted in excellent exfoliation of silicon film.

As discussed above, at least a part of a 50 nm thick, in certain embodiments at least a part of 100 nm thick, in certain embodiments at least a part of 150 nm thick, in certain embodiments at least a part of 200 nm thick, of the exfoliation film produced by using the process according to the present invention is not damaged by the ion-implantation process. In is preferred that the structure of at least a majority of the thickness of the exfoliation film is not damaged. By "majority", it is meant at least half of the thickness of the exfoliation film is not damaged. By "not damaged," it is meant that the internal structure of the film, or the non-damaged part thereof, is not significantly altered during the ion-implantation process, such that the exfoliation film, or the relevant part thereof, may not be suitable for use in the intended applications.

The thickness of the ion implantation zone, comprising a single implanted ion species or multiple implanted ion species, can be controlled to be less than about 1000 nm, in certain embodiments less than about 500 nm, in certain other embodiments less than about 300 nm, in certain other embodiments less than about 200 nm, according to the process of the present invention.

Upon ion implantation, the exfoliation film may be separated from the rest of the donor wafer by using methods described, e.g., in US 2004/0229444. Without intending to be bound by any particular theory, it is believed that the ions implanted causes defects in the implantation zone upon further treatment, such as heating, by, e.g., forming micro gas bubbles. The high density of defects in that zone leads to the splitting at a location within the implantation zone and exfoliation of the exfoliation film and part of the implantation zone from the rest of the donor substrate.

A substantially independent exfoliation film may be produced by splitting the exfoliation film from the donor substrate upon ion implantation in a step (V):

separating the exfoliation film and at least part of the material in the ion implantation zone from the donor substrate at a location within the implantation zone.

The thin film may then be used for down stream processing in the manufacture of SOI structures, such as by bonding to an insulator recipient substrate afterwards. However, because the exfoliation film is very thin, it is usually very difficult to handle without a pre-bonded support. Thus, typically, in the process for making SOI structures according to the first aspect of the present invention, prior to separation of the exfoliation film in step (V), the following step (IV) is implemented:

(IV) bonding the first donor external surface to a recipient substrate.

The recipient substrate for bonding to the donor substrate can be a semiconductor wafer with or without an oxide surface layer; a glass plate; a plate of crystalline materials, and a glass-ceramic plate. In certain embodiments, the recipient substrate is a single-crystalline silicon wafer with a surface oxidation layer formed by, e.g., thermal growth of $SiO_2$ layer, and the like. In certain embodiments, the recipient substrate comprises $SiO_2$. In certain embodiments, the recipient substrate is a high-purity $SiO_2$ plate. In certain embodiments, the recipient substrate comprises a crystalline material such as sapphire. In certain embodiments, the recipient substrate comprises an oxide glass or oxide glass-ceramic material. As is described in US 2004/0229444 A1, in certain embodiments, the recipient substrate comprises an oxide glass or oxide glass-ceramic materials having metal ions. Thus, the process according to the first aspect of the present invention may be advantageously used for the production of (i) conventional SOI and SiOI structures where in the past beam line ion implantation has been used, and (ii) un-convention SOI structures, such as SOG and SiOG structures described in US 2004/0229444 A1.

Conventional bonding methods used in the semiconductor industry, such as wafer bonding, fusion bonding, and anodic bonding.

A method particularly useful in bonding the donor substrate to a glass or glass-ceramic recipient substrate, illustrated in US 2004/0229444 A1, involves applying (a) forces to the donor and recipient substrates such that they are pressed into close contact; (b) electric field within the donor and recipient substrates such that the electrical potential in the donor substrate is higher than that in the recipient substrate; and (c) a temperature gradient between the donor and recipient substrates.

After ion implantation of the donor substrate, but before bonding the donor substrate to the recipient substrate, surface cleaning of both substrates are usually required in order to obtain bonding with sufficient strength. For example, after hydrogen ion implantation to a silicon substrate, a plurality of hydrogen groups are generated at the surface of the exfoliation film. Directly bonding the exfoliation film surface to a surface of the recipient substrate without reducing or eliminating the surface hydrogen groups usually requires the use of significantly higher external force due to the repulsion caused by the surface groups. Thus, a step is usually needed after the ion implantation but before bonding to reduce the hydrogen groups from the surface. As is taught in US 2004/0229444 A1, such hydrogen group reduction can be effected by, inter alia, oxygen plasma treatment, ozone treatment, $H_2O_2$ treatment, $H_2O_2$ and ammonia treatment, and $H_2O_2$ and acid treatment.

The second aspect of the present invention is directed to a process for making SOG structure by using mass-separated ion shower. In broad terms, it comprises the following steps:

(A1) providing a donor substrate and a recipient substrate, wherein:

(1) the donor substrate comprises a semiconductor material and a first donor external surface for bonding with the recipient substrate (first bonding surface) and a second donor external surface;

(2) the recipient substrate comprises an oxide glass or oxide glass-ceramic and two external surfaces: (i) a first recipient external surface for bonding to the first substrate (the second bonding surface); and (ii) a second recipient external surface;

(A2) implanting a plurality of ions belonging to a first species through the first donor external surface into an ion implantation zone of the donor substrate at a depth below the first donor external surface by using a first ion shower purified by electromagnetic separation such that the internal structure of at least a part 50 nm thick, in certain embodiments at least a part 100 nm thick, in certain embodiments at least a part 150 nm thick, in certain embodiments at least a part 200 nm thick, of the film of material sandwiched between the ion implantation zone and the first donor external surface ("exfoliation film") is essentially not damaged;

(B) after steps (A1) and (A2), bringing the first and second bonding surfaces into contact;

(C) for a period of time sufficient for the donor and recipient substrates to bond to one another at the first and second bonding surfaces, simultaneously:

(1) applying forces to the donor substrate and/or the recipient substrate such that the first and second bonding surfaces are pressed into contact;

(2) subjecting the donor and recipient substrates to an electric field having a general direction of from the second recipient external surface to the second donor external surface; and (3) heating the donor and recipient substrates, said heating being characterized in that the second donor and recipient external surfaces have average temperatures $T_1$, and $T_2$, respectively, said temperatures being selected such that upon cooling to a common temperature, the donor and recipient substrates undergo differential contraction to thereby weaken the donor substrate at the ion implantation zone; and (D) cooling the bonded donor and recipient substrates and splitting the donor substrate at the ion implantation zone; wherein the oxide glass or oxide glass-ceramic comprises positive ions which during step (C) move within the recipient substrate in a direction away from the second bonding surface and towards the second recipient external surface.

Thus the second aspect is an embodiment of the first aspect of the present invention described supra in general terms. Thus, the first aspect of the present invention is further illustrated by the following description of the second aspect. The above generally description of the first aspect of the present invention is also applicable to the second aspect mutatis mutandis.

Figure 5:
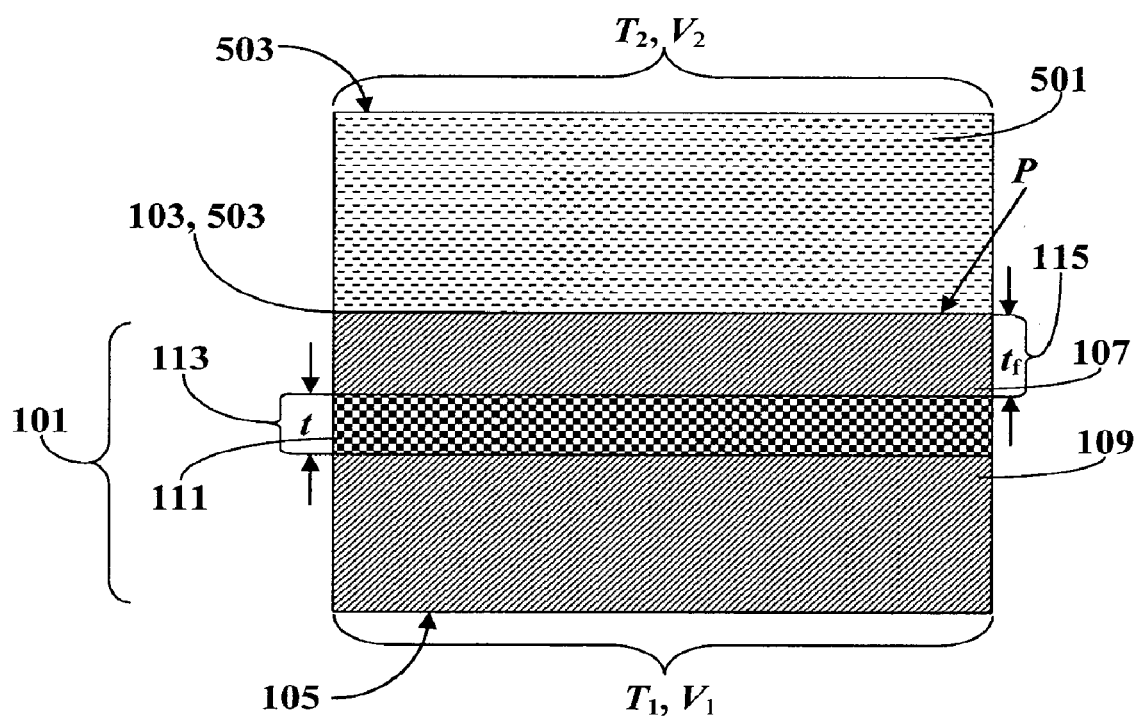
FIG. 5 is a schematic illustration of an ion-implanted donor substrate being bonded with a recipient substrate in the presence of an electric field, temperature gradient and pressure.
Figure 6:
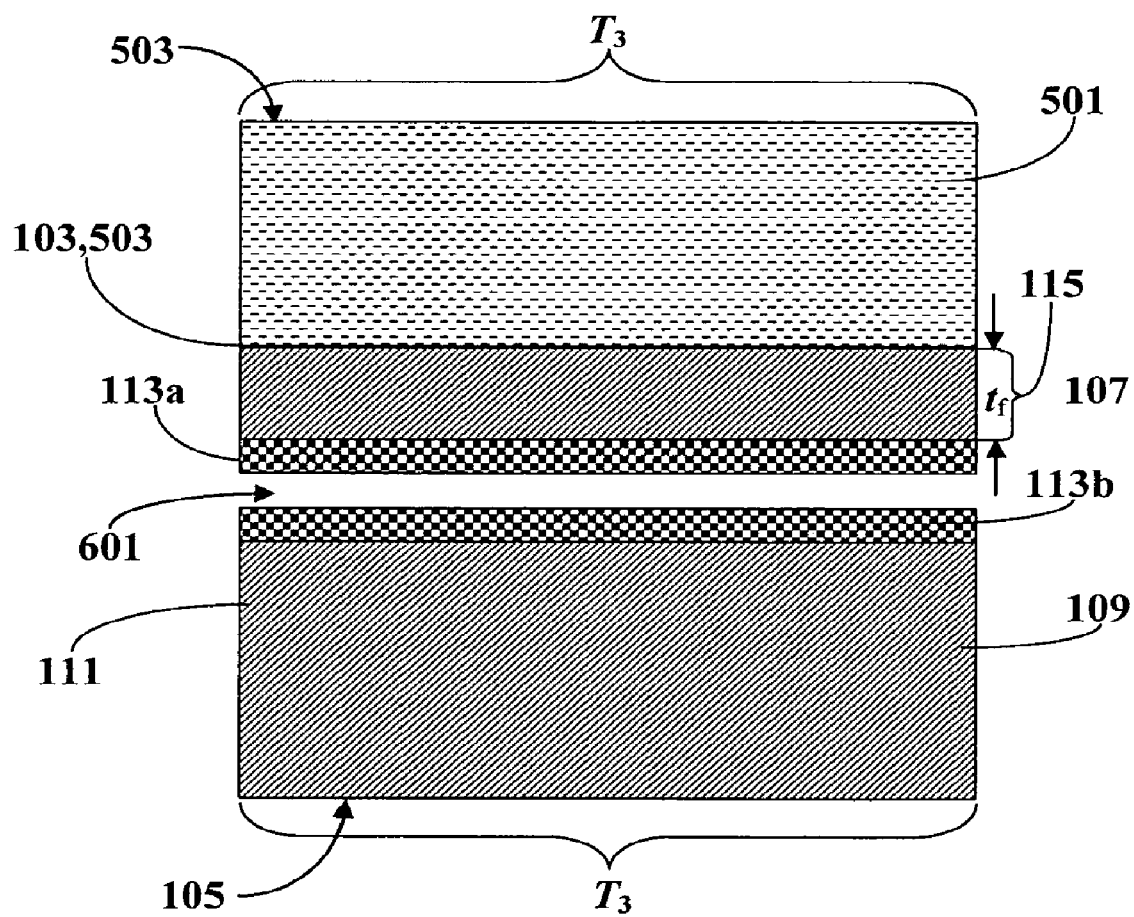
FIG. 6 is a schematic illustration of the splitting of the structure of FIG. 5 to form a SOI structure after the structure of FIG. 5 is cooled to a temperature of $T_3$.

FIGS. 5 and 6 schematically illustrate an embodiment of the process according to the second aspect of the present invention. In FIG. 5, a semiconductor donor substrate 101 shown in FIG. 1 is allowed to bond with a glass or glass-ceramic recipient substrate 501 having a first recipient external surface 503 (second boding surface) and a second recipient external surface 505. A pressure P is applied so that the first donor external surface 103 (first bonding surface) and the first recipient external surface 503 (second bonding surface) are placed into close contact. The donor substrate 101 is heated to a temperature $T_1$ and applied with a voltage $V_1$. The recipient substrate 501 is heated to a differing temperature $T_2$ and applied with a lower voltage $V_2$. Thus bonding between the donor substrate 101 and the recipient substrate 501 is effected by applying external pressure, temperature gradient and electric field. After bonding for a sufficient period of time, the voltages and pressure applied to the substrates are withdrawn, and the substrates were allowed to cool to a common temperature $T_3$ (such as room temperature). Due to differential contraction of both substrates (explained in more details infra), the ion implantation zone 113 is weakened and separated into two parts: 113a bonding to the exfoliation film 115 which is bonded to the recipient substrate, and 113b bonding to the rest of the donor substrate.

Certain specific embodiments of the process according to the second aspect of the present invention may comprise the following steps:

(A') providing first and second substrates wherein:
  (1) the first substrate comprises a first external surface for bonding to the second substrate (the first bonding surface), a second external surface for applying force to the first substrate (the first force-applying surface), and an internal zone for separating the first substrate into a first part and a second part (the internal zone is hereinafter referred to as the "separation zone," which, is an ion implantation zone formed by using the purified ion shower implantation according to the first aspect of the present invention, described supra), wherein:
    (a') the first bonding surface, the first force-applying surface, and the separation zone are substantially parallel to one another;
    (b') the second part is between the separation zone and the first bonding surface; and
    (c') the first substrate comprises a substantially single-crystalline semiconductor material; and
  (2) the second substrate comprises two external surfaces, one for bonding to the first substrate (the second bonding surface) and another for applying force to the second substrate (the second force-applying surface), wherein:
    (a') the second bonding surface and the second force-applying surface are substantially parallel to one another and are separated from one another by a distance $D_2$; and
    (b') the second substrate comprises an oxide glass or an oxide glass-ceramic;
(B') bringing the first and second bonding surfaces into contact (once brought into contact, the first and second bonding surfaces form what is referred to herein as the "interface" between the first and second substrates);
(C') for a period of time sufficient for the first and second substrates to bond to one another at the first and second bonding surfaces (i.e., at the interface), simultaneously:
  (1) applying force to the first and second force-applying surfaces to press the first and second bonding surfaces together;
  (2) subjecting the first and second substrates to an electric field which is characterized by first and second voltages $V_1$ and $V_2$ at the first and second force-applying surfaces, respectively, said voltages being uniform at those surfaces with $V_1$ being higher than $V_2$ so that the electric field is directed from the first substrate to the second substrate; and
  (3) heating the first and second substrates, said heating being characterized by first and second temperatures $T_1$ and $T_2$ at the first and second force-applying surfaces, respectively, said temperatures being uniform at those surfaces and being selected so that upon cooling to a common temperature, the first and second substrates undergo differential contraction to thereby weaken the first substrate at the separation zone; and
  (D') cooling the bonded first and second substrates (e.g., to a common temperature such as room temperature) and separating the first and second parts at the separation zone;

wherein the oxide glass or oxide glass-ceramic has one or both of the following sets of characteristics:
  (i) the oxide glass or oxide glass-ceramic has a strain point of less than 1,000° C. and comprises positive ions (e.g., alkali or alkaline-earth ions) which during step (C'), move within the second substrate in a direction away from the second bonding surface and towards the second force-applying surface; and/or
  (ii) the oxide glass or oxide glass-ceramic comprises (a') non-bridging oxygens and (b') positive ions (e.g., alkali or alkaline-earth ions) which during step (C'), move within the second substrate in a direction away from the second bonding surface and towards the second force-applying surface.

As known in the art, non-bridging oxygens in an oxide glass or in the glass phase of an oxide glass-ceramic are those oxygens contributed to the glass by non-network forming components of the glass. For example, in the case of commercially available LCD display glass such as Corning Incorporated Glass No. 1737 and Corning Incorporated Glass No. EAGLE 2000™, the non-bridging oxygens include those oxygens which are part of the glass through the incorporation of alkaline-earth oxides (e.g., MgO, CaO, SrO, and/or BaO) in the glass composition.

Although not wishing to be bound by any particular theory of operation, it is believed that an electrolysis-type reaction takes place during step (C'). In particular, it is believed that the semiconductor substrate (first substrate) serves as the positive electrode for the electrolysis-type reaction and that reactive oxygen is produced in the region of the interface between the first and second substrates. This oxygen is believed to react with the semiconductor material (e.g., silicon) forming, in situ, a hybrid region of oxidized semiconductor (e.g., a silicon oxide region for a silicon-based semiconductor). This hybrid region begins at the interface and extends into the first substrate. The presence of non-bridging oxygens in the oxide glass or oxide glass-ceramic of the second substrate is believed to play a role in the generation of the oxygens that react with the semiconductor material of the first substrate.

It is believed that such generation of reactive oxygen and its combination with the semiconductor material is a source of the strong bond between the semiconductor material of the first substrate and the oxide glass or oxide glass-ceramic of the second substrate, i.e., at least a part (and potentially all) of the bond between the first and second substrates is through the reaction of the semiconductor material with reactive oxygen originating from the second substrate. Significantly, unlike prior techniques, this strong bond is achieved without the need for a high temperature treatment, i.e., a treatment at a temperature above 1,000° C.

This ability to avoid high temperature processing allows the second substrate to be a material which can be manufactured in large quantities at low cost. That is, by eliminating high temperature processing, the invention eliminates the need for a support substrate composed of an expensive high temperature material, such as, silicon, quartz, diamond, sapphire, etc.

In particular, the ability to achieve a strong bond without the need for a high temperature treatment allows the second substrate to be composed of an oxide glass or an oxide glass-ceramic in one embodiment the glass or glass-ceramic exhibits a strain point less than 1,000° C. More particularly, for display applications, the oxide glass or oxide glass-ceramic typically has a strain point less than 800° C., and in further embodiments less than 700° C. For electronics and other applications, the strain point is preferably less than 1,000° C. As well known in the glass making art, glasses and glass-ceramics having lower strain points are easier to manufacture than glasses and glass-ceramics having higher strain points.

To facilitate bonding, the oxide glass or oxide glass-ceramic should be able to conduct electricity at least to some extent. The conductivity of oxide glasses and oxide glass-ceramics depends on their temperature and thus in achieving a strong bond between the semiconductor material and the oxide glass or oxide glass-ceramic, there is a balance among: 1) the conductivity of the glass or glass-ceramic, 2) the temperatures ($T_1$ and $T_2$) used in step (C'), 3) the strength of the electric field applied to the first and second substrates during step (C'), and 4) the amount of time during which step (C') is performed.

As a general guideline, the oxide glass or oxide glass-ceramic preferably has a resistivity $\rho$ at 250° C. that is less than or equal to $10^{16}$ $\Omega \cdot cm$ (i.e., a conductivity at 250° C. that is greater than or equal to $10^{-16}$ Siemens/cm). More preferably, $\rho$ at 250° C. is less than or equal to $10^{13}$ $\Omega \cdot cm$, and most preferably, it is less than or equal to $10^{11.5}$ $\Omega \cdot cm$. It should be noted that although quartz has the requisite resistivity at 250° C. of $10^{11.8}$ $\Omega \cdot cm$, it lacks positive ions that can move during step (C'), and it thus follows that quartz is unsuitable for use as the second substrate in producing SOI structures in accordance with the above procedures.

For any particular set of first and second substrates, persons skilled in the art will readily be able to determine suitable combinations of time, temperature, and field strength for step (C') from the present disclosure. In particular, such persons will be able to select combinations of these parameters which create a bond between the semiconductor and the oxide glass or oxide glass-ceramic which is strong enough for the SOI structure to withstand the various forces and environmental conditions to which it will be exposed during further processing and/or use.

In addition to the above role in bonding, the electric field applied in step (C') also moves positive ions (cations) within the second substrate in a direction from the second substrate's bonding surface (the second bonding surface) towards its force-applying surface (the second force-applying surface). Such movement preferably forms a depletion region (23) which begins at the interface between the first and second substrates and extends into the second substrate, i.e., the depletion region begins at the second bonding surface and extends into the second substrate towards the second force-applying surface.

The formation of such a depletion region is especially desirable when the oxide glass or oxide glass-ceramic contains alkali ions, e.g., $Li^{+1}$, $Na^{-1}$, and/or $K^{+1}$ ions, since such ions are known to interfere with the operation of semiconductor devices. Alkaline-earth ions, e.g., $Mg^{+2}$, $Ca^{+2}$, $Sr^{+2}$, and/or $Ba^{+2}$, can also interfere with the operation of semiconductor devices and thus the depletion region also preferably has reduced concentrations of these ions.

Significantly, it has been found that the depletion region once formed is stable over time even if the SOI structure is heated to an elevated temperature comparable to, or even to some extent higher than, that used in step (C'). Having been formed at an elevated temperature, the depletion region is especially stable at the normal operating and formation temperatures of SOI structures. These considerations ensure that alkali and alkaline-earth ions will not diffuse back from the oxide glass or oxide glass-ceramic into the semiconductor of the SOI structure during use or further device processing, which is an important benefit derived from using an electric field as part of the bonding process of step (C').

As with selecting the operating parameters to achieve a strong bond, the operating parameters needed to achieve a depletion region of a desired width and a desired reduced positive ion concentration for all of the positive ions of concern can be readily determined by persons skilled in the art from the present disclosure. When present, the depletion region is a characteristic feature of an SOI structure produced in accordance with the method aspects of the present invention.

In addition to the depletion region, the application of the electric field can also create "pile-up" regions for one or more of the mobile positive ions contained in the oxide glass or oxide glass-ceramic. When present, such regions are located at or near the side (edge) of the depletion region farthest from the interface between the first and second substrates. Within the pile-up region, the positive ion has a concentration above its bulk concentration. For example, when measured in atomic percent, the peak concentration of the positive ion in the pile-up region can be, for example, up to 5 times greater than the bulk concentration. Like the depletion region, such a pile-up region, when present, is a characteristic feature of an SOI structure produced in accordance with the second aspect of the present invention.

The temperatures of the first and second substrates during step (C'), i.e., the values of $T_1$, and $T_2$, are chosen to perform the important function of weakening (e.g., fracturing) the semiconductor substrate (first substrate) at the separation zone so that the first substrate can be divided into first and second parts, the second part being bonded to the second substrate. In this way, an SOI structure having a semiconductor portion of a desired thickness is achieved, e.g., a thickness Ds between, for example, 10 nanometers and 500 nanometers and, in some cases, up to 5 microns.

Although not wishing to be bound by any particular theory of operation, it is believed that the weakening of the semiconductor substrate at the separation zone primarily occurs as the bonded first and second substrates are cooled after step (C'), e.g., to room temperature. By the proper selection of $T_1$, and $T_2$ (see below), this cooling causes the first and second substrates to differentially contract. This differential contraction applies stress to the first substrate which manifests itself as a weakening/fracturing of the first substrate at the separation zone. As discussed below, preferably, the differential contraction is such that the second substrate seeks to contract more than the first substrate.

As used herein, the phrase "differential contraction upon cooling to a common temperature" and similar phrases mean that if the first and second substrates were not bonded, they would contract to different extents by such cooling. However, since the first and second substrates become bonded during step (C') and are rigid materials, the amount of contraction of the individual substrates which actually occurs will be different from that which would occur if there were no bonding. This difference leads to one of the substrates experiencing tension and the other compression as a result of the cooling. The phrase "seeks to contract" and similar phrases are used herein to reflect the fact that the contraction of the substrates when bonded will in general be different from their non-bonded contraction, e.g., the substrate being discussed may seek to contract to a certain extent as a result of the cooling but may not and, in general, will not actually contract to that extent as a result of being bonded to the other substrate.

The values of $T_1$, and $T_2$ used during step (C') will depend on the relative coefficients of thermal expansion of the first and second substrates, the goal in choosing these values being to ensure that one of the substrates, preferably, the second substrate, seeks to contract to a greater extent than the other substrate, preferably, the first substrate, so as to apply stress to, and thus weaken, the separation zone during cooling.

In general terms, in order for the second substrate to seek to contract to a greater extent than the first substrate during cooling, $T_1$, $T_2$, and the CTE's of the first and second substrates ($CTE_1$ and $CTE_2$, respectively) should satisfy the relationship:

$$CTE_2 \cdot T_2 > CTE_1 \cdot T_1,$$

where $CTE_1$ is the 0° C. coefficient of thermal expansion of the substantially single-crystalline semiconductor material and $CTE_2$ is the 0-300° C. coefficient of thermal expansion of the oxide glass or oxide glass-ceramic. This relationship assumes that the first and second substrates are cooled to a common reference temperature of 0° C., and $T_1$ and $T_2$ are expressed in terms of ° C.

In applying this relationship, it should be kept in mind that the oxide glass or oxide glass-ceramic preferably has a 0-300° C. coefficient of thermal expansion CTE which satisfies the relationship:

$$5 \times 10^{-7}/° C. \leq CTE \leq 75 \times 10^{-7}/° C.$$

For comparison, the 0° C. coefficient of thermal expansion of substantially single-crystalline silicon is approximately $24 \times 10^{-7}/° C.$, while the 0-300° C. average CTE is approximately $32.3 \times 10^{-7}/° C.$ Although a CTE for the second substrate which is less than or equal to $75 \times 10^{-7}/° C.$ is generally preferred, in some cases, the CTE of the second substrate can be above $75 \times 10^{-7}/° C.$, e.g., in the case of soda lime glasses for use in such applications as solar cells.

As can be seen from the $CTE_2 \cdot T_2 > CTE_1 \cdot T_1$ relationship, when the CTE of the oxide glass or oxide glass-ceramic ($CTE_2$) is less than that of the semiconductor material ($CTE_1$), a larger $T_2 - T_1$ difference will be needed in order for the second substrate to seek to contract more than the first substrate during cooling. Conversely, if the CTE of the oxide glass or oxide glass-ceramic is greater than that of the semiconductor material, a smaller $T_2 - T_1$ difference can be used. Indeed, if the CTE of the oxide glass or oxide glass-ceramic is sufficiently above than that of the semiconductor material, the $T_2 - T_1$ difference can become zero or even negative. However, in general, the CTE of the oxide glass or oxide glass-ceramic is chosen to be relatively close to that of the semiconductor material so that a positive $T_2 - T_1$ difference is needed to ensure that the second substrate will seek to contract more than the first substrate during cooling. Having $T_2 > T_1$ is also desirable since it can aid in bonding of the oxide glass or oxide glass-ceramic to the semiconductor material since it tends to make the oxide glass or oxide glass-ceramic more reactive. Also, having $T_2 > T_1$ is desirable since it can facilitate movement of positive ions away from the interface between the first and second substrates.

The differential contraction between the first and second substrates during cooling and the resulting weakening/fracturing of the first substrate at the separation zone can be achieved by approaches other than having the second substrate seek to contract more than the first substrate during the cooling. In particular, it can be the first substrate that seeks to contract more than the second substrate. Again, this differential contraction is achieved through the selection of the CTE's and temperatures of the first and second substrates. In general terms, for this case, $CTE_1 \cdot T_1$ needs to be greater than $CTE_2 \cdot T_2$.

When the first substrate seeks to contract more than the second substrate, the first substrate and, in particular, the second part of the first substrate, will end up under tension, rather than under compression, at the end of the cooling. In general, it is preferred for the semiconductor film (second part of the first substrate) to be under compression in the finished SOI structure, which makes the approach in which the differential contraction causes the second substrate to seek to contract more than the first substrate during cooling preferred. For some applications, however, having the semiconductor film under some tension may be preferred.

Thus, to summarize, although other sets of conditions can be used in the practice of the invention, in the preferred embodiments of the invention, $T_2$ is greater than $T_1$ during step (C') and the second substrate seeks to contract more than the first substrate during cooling from the elevated temperatures used during step (C').

Again, for any particular application of the invention (e.g., any particular semiconductor material and any particular oxide glass or oxide glass-ceramic), persons skilled in the art will readily be able to select values for $T_1$ and $T_2$ based on the present disclosure and the disclosure of US 2004/0229444A which should provide a level of differential contraction sufficient to weaken the separation zone so that the first and second parts of the first substrate can be separated from one another to produce the desired SOI structure.

Separation of the first and second parts at the separation zone results in each part having an "exfoliation" surface where the separation occurred. As known in the art, upon initial formation, i.e., before any subsequent surface treatments, such an exfoliation surface is characterized by a surface roughness which is generally at least on the order of less than 1 nanometers RMS, e.g., in the range of 1-100 nanometers, and depending on the process conditions used, will typically have a concentration of the implanted ion used to form the separation zone, e.g., hydrogen, helium, and the like, above that present in the body of the first or second parts. In typical applications, the exfoliation surface is polished prior to use so that its RMS surface roughness is reduced to 1 nanometer or less, e.g., to a RMS surface roughness on the order of 0.1 nanometers for electronic applications. As used herein, the phrase "exfoliation surface" includes the surface as initially formed and the surface after any subsequent treatments.

The pressure applied to the first and second substrates during step (C') ensures that those substrates are in intimate contact while undergoing the heat and electric field treatments of that step. In this way, strong bonding between the substrates can be achieved.

Generally, the semiconductor substrate (the first substrate, also the donor substrate) will be able to withstand higher levels of applied pressure than the glass or glass-ceramic substrate (the second substrate). Thus, the pressure is chosen to provide intimate contact between the substrates without damaging the second substrate.

A wide range of pressures can be used. For example, the force per unit area P' applied to the first and second force-applying surfaces of the first and second substrates, respectively, preferably satisfies the relationship:

$$1 \text{ psi} \leq P' \leq 100 \text{ psi};$$

and most preferably, the relationship:

$$1 \text{ psi} \leq P' \leq 50 \text{ psi}.$$

Again, the specific pressure value to be used for any particular application of the invention can be readily determined by persons skilled in the art from the present disclosure.

The second aspect of the invention can be practiced using a single first substrate and a single second substrate. Alternatively, the methods of the invention can be used to form more than one SOI structure on a single second substrate.

For example, steps (A') through (D') can be used to form a first SOI structure which does not cover the entire area of the second substrate. Thereafter, steps (A') through (D') can be repeated to form a second SOI structure which covers all or part of the area not covered by the first SOI structure. The second SOI structure may be the same or different from the first SOI structure, e.g., the second SOI structure can be made using a first substrate composed of a substantially single-crystalline semiconductor material that is the same or different from the semiconductor material of the first substrate used in producing the first SOI structure.

More preferably, multiple SOI structures are formed simultaneously on a single second substrate by providing multiple (i.e., two or more) first substrates in step (A'), bringing all of those first substrates into contact with a single second substrate in step (B'), and then performing steps (C') and (D') on the resulting multiple first substrate/single second substrate assembly. The multiple first substrates provided in step (A') can all be the same, all different, or some the same and some different.

Whichever approach is used, the resulting multiple SOI structures on a single oxide glass or oxide glass-ceramic substrate can be contiguous or separated as appropriate for the particular application of the invention. If desired, gaps between some or all of the adjacent structures can be filled with, for example, semiconductor material to obtain one or more continuous semiconductor layers on an oxide glass or oxide glass-ceramic substrate of any desired size.

The SOI structures produced according to the second aspect of the present invention is desirably a semiconductor-on-insulator structure comprising first and second layers which are attached to one another either directly or through one or more intermediate layers, wherein:

(a') the first layer comprises a substantially single-crystalline semiconductor material;

(b') the second layer comprises an oxide glass or an oxide glass-ceramic; and (c') the bond strength between the first and second layers is at least 8 joules/meter$^2$, preferably at least 10 joules/meter$^2$, and most preferably at least 15 joules/meter$^2$.

As used throughout this specification and in the claims, the bond strength between a semiconductor layer and a glass or glass-ceramic layer of an SOI structure is determined using an indentation procedure. Such procedures are widely used to assess the adhesion characteristics of thin films and coatings to a wide variety of materials, including polymeric, metallic, and brittle materials. The technique provides a quantitative measure of adhesion in the form of the interfacial strain energy release rate.

As disclosed in the examples of United States Patent Application Publication No. 2004/0229444 A1, indentation measurements of silicon coatings on glass can be performed using a Nano Indenter II (MTS Systems Corporation, Eden Prairie, Minn.) equipped with a Berkovich diamond indenter. Other equipment can, of course, be used to determine bond strength values. As discussed in detail in Example 12 of United States Patent Application Publication No. 2004/0229444 A1, indentations were made covering a range of loads and the region immediately surrounding the indentations was examined for evidence of delamination. Calculations of bond energies were made in accordance with the following reference, the relevant portions of which are incorporated herein by reference: D. B. Marshall and A. G. Evans, Measurement of Adherence of Residually Stressed Thin Films by Indentation, I. Mechanics of Interface Delamination, J. Appl. Phys., 56 [10] 2632-2638 (1984). The procedures of this reference are to be used in calculating the bond energies called for by the claims set forth below.

When the SOI structure is produced using the process according to the second aspect of the invention, the first layer will desirably have a surface farthest from the second layer which is an exfoliation surface. In this case, the oxide glass or oxide glass ceramic of the second layer will also preferably have:

(a') a 0-300° C. coefficient of thermal expansion CTE and a 250° C. resistivity ρ which satisfy the relationships:

$5 \times 10^{-7}/°$ C.$\leq$CTE$\leq 75 \times 10^{-7}/°$ C., and $\rho \leq 10^{16}$ Ω·cm, and (b') a strain point $T_s$ of less than 1,000° C.

The oxide glass or oxide glass ceramic will also comprise positive ions whose distribution within the oxide glass or oxide glass-ceramic can be altered by an electric field when the temperature T of the oxide glass or oxide glass-ceramic satisfies the relationship:

$T_s - 350 \leq T \leq T_s + 350$, where $T_s$ and T are in ° C.

As will be appreciated, the strength of the bond between the glass or glass-ceramic layer and the semiconductor layer, e.g., silicon layer, attached thereto is a key property of an SOI structure. High bond strength and durability are very important to ensure that the SOI structure can withstand the processing associated with the manufacture of thin film transistors and other devices on or within the structure. For example, a high bond strength is important in providing device integrity during cutting, polishing, and similar processing steps. A high bond strength also allows semiconductor films of various thicknesses to be processed while attached to glass or glass-ceramic substrates, including thin semiconductor films.

It is known that the bond energy for the Si—SiO$_2$ bond for the standard thermal process for producing SOI structures depends on the annealing temperature and is in the range of 1-4 joules/meter$^2$ after a 1100° C. anneal. See Semiconductor Wafer Bonding, Q. Y. Tong, U. Gosele, John Wiley & Sons Inc., New York, N.Y., page 108, (1994). As demonstrated by the examples set forth in US 2004/0229444 A1, in accordance with the second aspect of the invention, bond strengths for SOI structures much higher than those previously achieved are provided, i.e., bond strengths of at least 8 joules/meter$^2$.

In accordance with the process of the second aspect of the present invention, SOI structures having the following characteristics may be produced:

I: A semiconductor-on-insulator structure comprising first and second layers which are attached to one another either directly or through one or more intermediate layers, wherein:

(a') the first layer:

(i) comprises a substantially single-crystalline semiconductor material;

(ii) has first and second substantially parallel faces separated by a distance $D_S$, the first face being closer to the second layer than the second face;

(iii) has a reference surface which 1) is within the first layer, 2) is substantially parallel to the first face, and 3) is separated from that face by a distance $D_S/2$; and (iv) has a region of enhanced oxygen concentration which begins at the first face and extends towards the second face, said region having a thickness $\delta_H$ which satisfies the relationship:

$\delta_H \leq 200$ nanometers, where $\delta_H$ is the distance between the first face and a surface which 1) is within the first layer, 2) is substantially parallel to the first face, and 3) is the surface farthest from the first face for which the following relationship is satisfied:

$$C_O(x) - C_{O/Ref} \geq 50 \text{ percent}, 0 \leq x \leq \delta_H,$$

where:
$C_O(x)$ is the concentration of oxygen as a function of distance x from the first face,
$C_{O/Ref}$ is the concentration of oxygen at the reference surface, and
$C_O(x)$ and $C_{O/Ref}$ are in atomic percent; and
(b') the second layer comprises an oxide glass or an oxide glass-ceramic.

It should be noted that the region of enhanced oxygen concentration of this aspect of the invention is to be distinguished from an oxide layer formed on the outside of the semiconductor substrate prior to bonding (see, for example, U.S. Pat. No. 5,909,627) in that the region of the present invention is within the semiconductor material. In particular, when the SOI structure is produced using the process according to the second aspect of the invention, the region of enhanced oxygen concentration is formed in situ as the composite of the semiconductor layer and the oxide glass or oxide glass-layer is formed.

II: A semiconductor-on-insulator structure comprising first and second layers which are attached to one another either directly or through one or more intermediate layers, wherein:
(a') the first layer comprises a substantially single-crystalline semiconductor material, said layer having a surface farthest from the second layer which is an exfoliation surface; and
(b') the second layer:
(i) has first and second substantially parallel faces separated by a distance $D_2$, the first face being closer to the first layer than the second face;
(ii) has a reference surface which 1) is within the second layer, 2) is substantially parallel to the first face, and 3) is separated from that face by a distance $D_2/2$;
(iii) comprises an oxide glass or an oxide glass-ceramic which comprises positive ions of one or more types, each type of positive ion having a reference concentration $C_{i/Ref}$ at the reference surface; and
(iv) has a region which begins at the first face and extends towards the reference surface in which the concentration of at least one type of positive ion is depleted relative to the reference concentration $C_{i/Ref}$ for that ion (the positive ion depletion region).

III: A semiconductor-on-insulator structure comprising first and second layers which are attached to one another either directly or through one or more intermediate layers, wherein:
(a') the first layer comprises a substantially single-crystalline semiconductor material, said layer having a thickness of less than 10 microns (in certain embodiments, less than 5 micron; in certain other embodiments, less than 1 micron); and
(b') the second layer:
(i) has first and second substantially parallel faces separated by a distance $D_2$, the first face being closer to the first layer than the second face;
(ii) has a reference surface which 1) is within the second layer, 2) is substantially parallel to the first face, and 3) is separated from that face by a distance $D_2/2$;
(iii) comprises an oxide glass or an oxide glass-ceramic which comprises positive ions of one or more types, each type of positive ion having a reference concentration $C_{i/Ref}$ at the reference surface; and
(iv) has a region which begins at the first face and extends towards the reference surface in which the concentration of at least one type of positive ion is depleted relative to the reference concentration $C_{i/Ref}$ for that ion (the positive ion depletion region).

In connection with this SOI structure, it should be noted that the 10 micron limitation of subparagraph (a') is substantially less than the thickness of a semiconductor wafer. For example, commercially available silicon wafers generally have thicknesses greater than 100 microns.

IV: A semiconductor-on-insulator structure comprising first and second layers which are attached to one another either directly or through one or more intermediate layers, wherein:
(a') the first layer comprises a substantially single-crystalline semiconductor material; and
(b') the second layer comprises an oxide glass or an oxide glass-ceramic which comprises positive ions of one or more types, wherein the sum of the concentrations of lithium, sodium, and potassium ions in the oxide glass or oxide glass-ceramic on an oxide basis is less than 1.0 weight percent and, preferably, less than 0.1 weight percent (i.e., wt. % $Li_2O$+wt. % $K_2O$+wt. % $Na_2O$<1.0 wt. %, preferably, <0.1 wt. %), wherein the first layer has a maximum dimension (e.g., diameter in the case of a circular layer, diagonal in the case of a rectangular layer, etc.) greater than 10 centimeters.

V: A semiconductor-on-insulator structure comprising first and second layers which are attached to one another either directly or through one or more intermediate layers, wherein:
(a') the first layer comprises a substantially single-crystalline semiconductor material; and
(b') the second layer:
(i) has first and second substantially parallel faces separated by a distance $D_2$, the first face being closer to the first layer than the second face;
(ii) has a reference surface which 1) is within the second layer, 2) is substantially parallel to the first face, and 3) is separated from that face by a distance $D_2/2$;
(iii) comprises an oxide glass or an oxide glass-ceramic which comprises positive ions of one or more types, each type of positive ion having a reference concentration $C_{i/Ref}$ at the reference surface;
(iv) has a region which begins at the first face and extends towards the reference surface in which the concentration of at least one type of positive ion is depleted relative to the reference concentration $C_{i/Ref}$ for that ion (the positive ion depletion region), said region having a distal edge (i.e., the edge closest to the reference surface); and
(v) has a region in the vicinity of said distal edge of the positive ion depletion region in which the concentration of at least one type of positive ion is enhanced relative to $C_{i/Ref}$ for that ion (the pile-up region).

VI: A semiconductor-on-insulator structure comprising first and second layers which are attached to one another either directly or through one or more intermediate layers with a bond strength of at least 8 joules/meter, in certain embodiments at least 10 joules/meter$^2$, and in certain embodiments at least 15 joules/meter$^2$, said first layer comprising a substantially single-crystalline semiconductor material and said second layer comprising an oxide glass or an oxide glass-ceramic wherein at least a portion of the first layer proximal to the second layer comprises recesses which divide said portion into substantially isolated regions which can expand and contract relatively independently of one another.

In certain embodiments of this SOI structure, the recesses extend through the entire thickness ($D_S$) of the first layer.

VII: A silicon-on-insulator structure comprising first and second layers which are directly attached to one another, said first layer comprising a substantially single-crystalline silicon material and said second layer (20) comprising a glass or a glass-ceramic which comprises silica and one or more other oxides as network formers (e.g., $B_2O_3$, $Al_2O_3$, and/or $P_2O_5$), said first layer comprising a region which contacts the second layer and comprises silicon oxide (i.e., $SiO_x$ where $1 \leq x \leq 2$) but does not comprise the one or more other oxides, said region having a thickness which is less than or equal to 200 nanometers.

VIII: A semiconductor-on-insulator structure comprising a substantially single-crystalline semiconductor material (material S) and an oxide glass or an oxide glass-ceramic which comprises positive ions (material G), wherein at least a part of the structure comprises in order:

material S;

material S with an enhanced oxygen content;

material G with a reduced positive ion concentration for at least one type of positive ion;

material G with an enhanced positive ion concentration for at least one type of positive ion; and material G.

In connection with each of the foregoing SOI structures I-VIII, and additional SOI structures described infra, that can be produced according to the process of the second aspect of the present invention, it should be noted that the "insulator" component of a semiconductor-on-insulator structure is automatically provided by the invention through the use of an oxide glass or an oxide glass-ceramic as the second substrate. The insulating function of the glass or glass-ceramic is even further enhanced when the interface (30) between the first and second substrates includes a positive ion depletion region. As a specific example, in the SOI structure VIII, all of the G materials are insulators. In addition, the S material with enhanced oxygen concentration may, at least to some extent, function as an insulator depending on the oxygen concentration achieved. In such cases, everything after the S material constitutes the insulator of the SOI structure. It should also be noted that the single-crystalline semiconductor materials may be also be doped with dopants at various levels, e.g., for the purpose of imparting semiconductive properties.

This automatic provision of the insulator function in accordance with the invention is to be contrasted with conventional SOI structures in which a semiconductor film is attached to a semiconductor wafer. To achieve an insulating function, an insulator layer, e.g., a $SiO_2$ layer, needs to be sandwiched (buried) between the semiconductor film and the semiconductor wafer.

In accordance with the second aspect of the invention, the methods of the present invention can be practiced to produce multiple SOI structures on a single oxide glass or oxide glass-ceramic substrate, where the SOI structures may all be the same, all different, or some the same and some different. Similarly, the products resulting from the second aspect of the present invention can have multiple first layers on a single second layer, where again, the first layers may all be the same, all different, or some the same and some different.

Whether a single first layer or a plurality of first layers are used, the resulting SOI structure can either have all or substantially all (i.e., >95%) of the first face of the second layer attached (either directly or through one or more intermediate layers) to one or more kinds of substantially single-crystalline semiconductor materials, or can have substantial areas of the first face that are associated with materials that are not substantially single-crystalline semiconductor materials (hereinafter, the "non-single-crystalline semiconductor areas").

In the non-single-crystalline semiconductor areas, the first face can be attached, either directly or through one or more intermediate layers, to, for example, amorphous and/or polycrystalline semiconductor materials, e.g., amorphous and/or polycrystalline silicon. The use of such less expensive materials can be particularly beneficial in display applications where substantially single-crystalline semiconductor materials are typically only needed for certain parts of the display electronics, e.g., for peripheral drivers, image processors, timing controllers, and the like, that require higher performance semiconductor materials. As well-known in the art, polycrystalline semiconductor materials and, in particular, polycrystalline silicon can be obtained by thermal crystallization (e.g., laser-based thermal crystallization) of amorphous materials after those materials have been applied to a substrate, such as, an LCD glass substrate.

The entire first face of the second layer, of course, does not have to be associated with substantially single-crystalline or non-single-crystalline semiconductor materials. Rather, specified areas can have the semiconductor materials with the spaces between such areas being either bare second layer or second layer attached to one or more non-semiconductor materials. The sizes of such spaces can be large or small as appropriate to the particular application of the invention. For example, in the case of display applications, e.g., liquid crystal displays, the great majority of the glass layer (e.g., greater than approximately 75-80%) will typically not be associated with either substantially single-crystalline or non-single-crystalline semiconductor materials.

Through the use of multiple first layers attached to a single second layer, SOI structures having extensive areas composed of substantially single-crystalline semiconductor materials can be obtained. Thus, in accordance with the process of the second aspect of the present invention, the following additional SOI structures can be produced:

IX. A semiconductor-on-insulator structure comprising first and second layers which are attached to one another either directly or through one or more intermediate layers, wherein:

(a') the first layer comprises a plurality of regions each of which comprises a substantially single-crystalline semiconductor material;

(b') the second layer comprises an oxide glass or an oxide glass-ceramic; and (c') the regions have surface areas Ai which satisfy the relationship:

$$\sum_{i=1}^{N} A_i > A_T, N > 1,$$

where $A_T$=750 centimeters$^2$ if any of the regions has a circular perimeter and $A_T$=500 centimeters$^2$ if none of the regions has a circular perimeter.

As above, the substantially single-crystalline semiconductor materials of the various regions can all be the same, all different, or some the same and some different. Similarly, if one or more intermediate layers are used, they can all be the same, all different, or some the same and some different for the various regions. In particular, one or more regions can have the substantially single-crystalline semiconductor material attached to the second layer through one or more intermediate layers, while one or more other regions can have the semiconductor material attached directly to the second layer.

In connection with the foregoing SOI structures I-IX that may be produced according to the process of the second aspect of the present invention, the one or more intermediate layers between the first and second substrates, if present, preferably have a combined thickness of less than 100 nm, in certain embodiments less than 50 nm, and certain embodiments, less than 30 nm.

In addition to the above-listed individual SOI structures I-IX, the process of the second aspect of the present invention may also be used to produce SOI structures comprising any and all combinations of the characteristics of I-IX. For example, certain embodiments of the SOI structures may preferably have a bond strength of at least 8 joules/meter, in certain embodiments preferably at least 10 joules/meter$^2$, and in certain embodiments most preferably at least 15 joules/meter. Similarly, the SOI structure may preferably includes at least one exfoliation surface, at least one positive ion depletion region, at least one pile-up region, and/or a semiconductor layer whose thickness is less than 10 microns.

The present invention is further illustrated by the following non-limiting examples.

EXAMPLES

Example 1

Comparative Example

A silicon wafer 150 mm diameter, 500 microns thick was $H_3^+$ ion-implanted at dosage of 2E16 (i.e., $2\times10^{16}$) $H_3^+$ ions/cm$^2$ and implantation energy of 60 KeV in a standard unmodified, conventional ion shower equipment. The wafer was then treated in oxygen plasma to oxidize the surface groups. A Corning Incorporated Eagle 2000™ glass wafer 100 mm in diameter was then washed with Fischer scientific Contrad 70 detergent in ultrasonic bath for 15 minutes followed by distilled water wash for 15 minutes in ultrasonic bath and then washed in 10% nitric acid followed by distilled water wash again. Both these wafers were finally cleaned in spin washer dryer with distilled water in the clean room.

Figure 7:
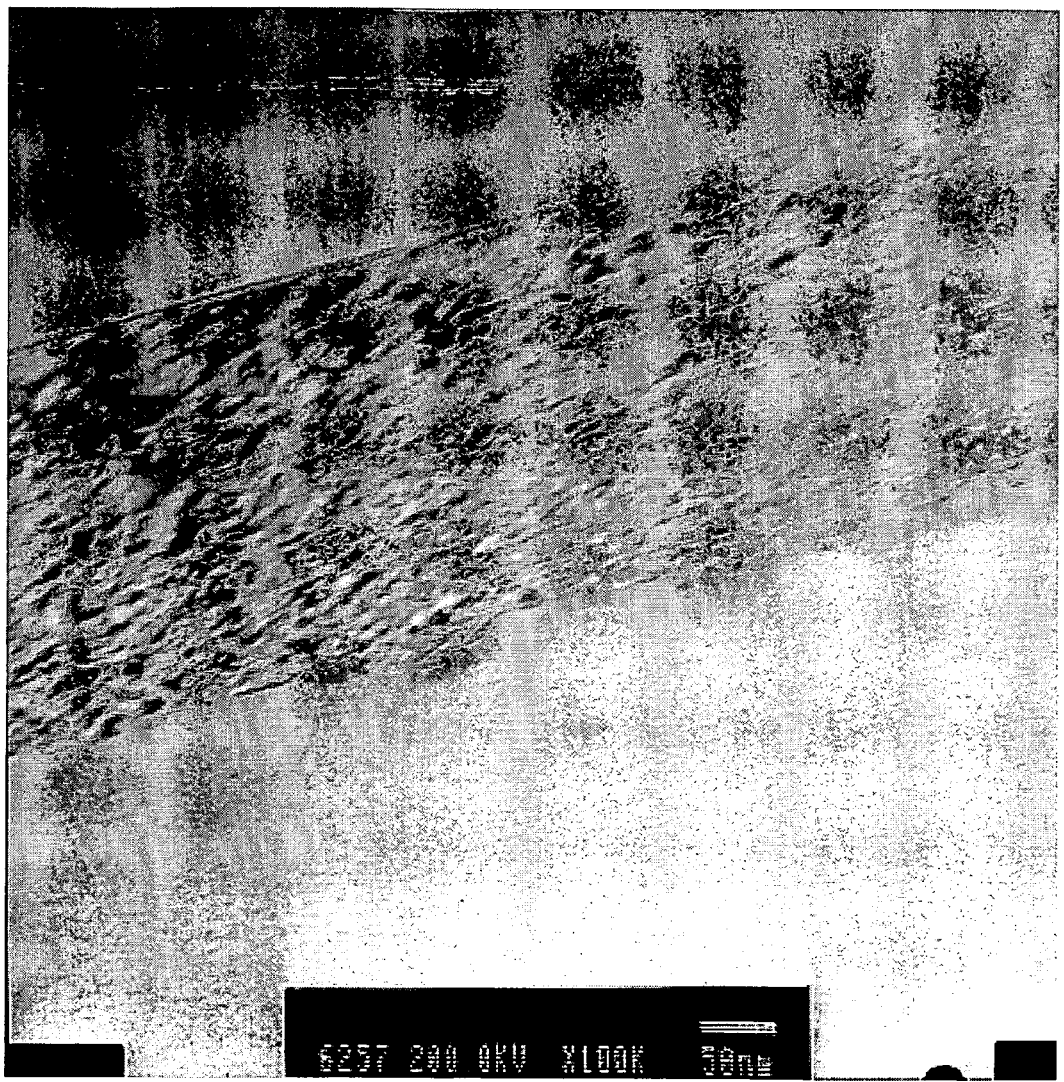
FIG. 7 is a TEM image of a thin exfoliated silicon film obtained by using conventional non-mass-separated ion shower, showing damages to the crystalline structure thereof.

The two wafers were then brought into contact ensuring that no air was trapped between the wafers and then the wafers were introduced into the bonder and bonded as taught in US 2004/0229444 A1. The glass wafer was placed on the negative electrode and the silicon wafer was placed on the positive electrode. The two wafers were heated to 525° C. (silicon wafer) and 575° C. (glass wafer). A potential of 1750 Volts was applied across the wafer surface. The voltage was applied for 20 minutes at the end of which the voltage was brought to zero and the wafers were cooled to room temperature. The wafers could be separated easily. TEM image was taken of the cross-section of the exfoliated silicon film. An image is presented in FIG. 7, which shows that the silicon film was damaged throughout the thickness making the silicon film of little use for the electronics applications.

Example 2

The Present Invention

The experiment of Example 1 is being repeated with the same experimental parameters but in a tool containing an analyzer magnet which allows mass separation and thus allows implantation of only the desired species $H_3^+$. This is expected to result in a silicon film with damage confined essentially only to the fracture zone which may be removed by polishing or etching revealing a good undamaged silicon layer useful for electronic devices. Additional experiments $H_3^+$ followed by He$^+$ ion implantation is expected to produce similar results as well.

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. A process for forming a SOI structure comprising the following steps:
   (I) providing a donor substrate comprising semiconductor material having a first donor external surface; and
   (II) implanting a plurality of ions belonging to a first species through the first donor external surface into an ion implantation zone at a depth below the first donor external surface by using a first ion shower purified by electromagnetic separation effected by magnetic means such that the structure of at least a 50 nm thick part of the material sandwiched between the ion implantation zone and the first donor external surface ("exfoliation film") is essentially not damaged.

2. A process according to claim 1, wherein in step (II), at least a 100 nm thick part, in certain embodiments at least a 150 nm thick part, in certain embodiments at least a 200 nm thick part, of the exfoliation film is essentially not damaged.

3. A process according to claim 1, wherein the exfoliation film comprises single crystalline silicon.

4. A process according to claim 1, wherein in step (II), the ion implantation zone has a thickness of not larger than about 1 µm, in certain embodiments not larger than about 500 nm, in certain other embodiments not larger than about 300 nm, in certain other embodiments not larger than about 200 nm.

5. A process according to claim 1, wherein in step (II), the depth of the ion implantation zone is less than about 1000 nm, in certain embodiments less than about 500 nm, in certain other embodiments less than about 300 nm, in certain other embodiments less than about 150 nm, in certain other embodiments less than about 100 nm.

6. A process according to claim 1, wherein the thickness of the non-damaged part of the exfoliation film is at least 50% of the total thickness of the exfoliation film, in certain embodiments at least 60% of the total thickness of the exfoliation film, in certain embodiments at least 80% of the total thickness of the exfoliation film, in certain embodiments at least 90%.

7. A process according to claim 1, wherein at least one of:
   in step (II), the first ion shower consists essentially of the ions belonging to a first species;
   the ions belonging to the first species is a single ion species selected from $H_3^+$, $H^+$, $H_2^+$, $D_2^+$, $D_3^+$, HD+, $H_2D^+$, $HD_2^+$, He$^+$, He$^{2+}$, O$^+$, $O_2^+$, $O^{2+}$ and $O_3^+$; and
   the ions belonging to the first species are essentially free of phosphorous, boron, arsenic, carbon, oxygen, nitrogen, fluorine, chlorine and metals.

8. A process according to claim 1, further comprising the following step (IIIB) separate from and independent of step (II):
   (IIIB) implanting a plurality of ions through the first donor external surface into the ion implantation zone at the depth below the first donor external surface by using a conventional ion shower.

9. A process according to claim 1, further comprising at least one of:

(IV) bonding the first donor external surface to a recipient substrate; and (V) separating the exfoliation film and at least part of the material in the ion implantation zone from the donor substrate at a location within the implantation zone.

10. A process according to claim 9, wherein the recipient substrate is selected from the group consisting of: a semiconductor wafer with or without an oxide surface layer; a glass plate; plate comprised of crystalline material and a glass-ceramic plate.

11. A process according to claim 9, wherein at least one of:
the recipient substrate is a silicon wafer with a $SiO_2$ surface layer, and the first donor external surface of is bonded to the $SiO_2$ surface layer in step (IV); and
the recipient substrate is a $SiO_2$ glass plate.

12. A process according to claim 9, wherein:
(1) the recipient substrate comprises oxide glass or oxide glass-ceramic; and
(2) in step (IV), the bonding is effected by applying (a) forces to the donor and recipient substrates such that they are pressed into close contact; (b) electrical field within the donor and recipient substrates such that the electrical potential in the donor substrate is higher than that in the recipient substrate; and (c) a temperature gradient between the donor and recipient substrates.

13. A process for forming a SOI structure comprising the following steps:
(A1) providing a donor substrate and a recipient substrate, wherein:
(1) the donor substrate comprises a semiconductor material and a first donor external surface for bonding with the recipient substrate (first bonding surface) and a second donor external surface;
(2) the recipient substrate comprises an oxide glass or oxide glass-ceramic and two external surfaces: (i) a first recipient external surface for bonding to the first substrate (the second bonding surface); and (ii) a second recipient external surface;
(A2) implanting a plurality of ions belonging to a first species through the first donor external surface into an ion implantation zone of the donor substrate at a depth below the first donor external surface by using a first on shower purified by, electromagnetic separation effected by magnetic means such that the internal structure of at least a 50 nm thick part of the film of material sandwiched between the ion implantation zone and the first donor external surface ("exfoliation film") is essentially not damaged;
(B) after steps (A1) and (A2), bringing the first and second bonding surfaces into contact;
(C) for a period of time sufficient for the donor and recipient substrates to bond to one another at the first and second bonding surfaces, simultaneously:
(1) applying forces to the donor substrate and/or the recipient substrate such that the first and second bonding surfaces are pressed into contact;
(2) subjecting the donor and recipient substrates to an electric field having a general direction of from the second recipient external surface to the second donor external surface; and
(3) heating the donor and recipient substrates, said heating being characterized in that the second donor and recipient external surfaces have average temperatures $T_1$ and $T_2$, respectively, said temperatures being selected such that upon cooling to a common temperature, the donor and recipient substrates undergo differential contraction to thereby weaken the donor substrate at the ion implantation zone; and
(D) cooling the bonded donor and recipient substrates and splitting the donor substrate at the ion implantation zone;
wherein the oxide glass or oxide glass-ceramic comprises positive ions which during step (C) move within the recipient substrate in a direction away from the second bonding surface and towards the second recipient external surface.

14. A process according to claim 13, wherein in step (A2), the structure of at least a 100 nm thick part, in certain embodiments at least a 150 nm thick part, in certain embodiments at least a 200 nm thick part, of the exfoliation film is not damaged.

15. A process according to claim 13, wherein at least one of
the exfoliation film comprises single crystalline semiconductor material; and
the exfoliation film comprises single crystalline silicon.

16. A process according to claim 13, wherein in step (II), the depth of the ion implantation zone is less than about 1000 nm, in certain embodiments less than about 500 nm, in certain other embodiments less than about 300 nm, in certain other embodiments less than about 150 nm, in certain other embodiments less than about 100 nm.

17. A process according to claim 13, wherein the thickness of the non-damaged part of the exfoliation film is at least 50% of the total thickness of the exfoliation film, in certain embodiments at least 60% of the total thickness of the exfoliation film, in certain embodiments at least 80% of the total thickness of the exfoliation film, in certain embodiments at least 90%.

18. A process according to claim 13, wherein in step (A2), the ion implantation zone has a thickness of not larger than about 1 μm, in certain embodiments not larger than about 500 nm, in certain other embodiments not larger than about 300 nm, in certain other embodiments not larger than about 200 nm.

19. A process according to claim 13, wherein at least one of:
in step (A2), the first ion shower consists essentially of the ions belonging to a first species;
the ions belonging to the first species is a single ion species selected from $H_3^+$, $H^+$, $H_2^+$, $D_2^+$, $D_3^+$, $HD^+$, $H_2D^+$, $HD_2^+$, $He^+$, $He^{2+}$, $O^+$, $O_2^+$, $O^{2+}$ and $O_3^+$; and
the ions belonging to the first species are essentially free of phosphorous, boron, arsenic, carbon, oxygen, nitrogen, fluorine, chlorine and metals.

20. A process according to claim 13, wherein after step (A2) but before step (B), the first bonding surface of the donor substrate is treated to reduce the hydrogen concentration thereof.

21. A process according to claim 20, wherein the hydrogen-concentration-reducing treatment causes the first bonding surface to be hydrophilic.

22. A process according to claim 20, wherein the hydrogen-concentration-reducing treatment is selected from oxygen plasma treatment, ozone treatment, treatment with $H_2O_2$, treatment with $H_2O_2$ and ammonia, treatment with $H_2O_2$ and an acid, and combinations thereof.

* * * * *

UNITED STATES PATENT AND TRADEMARK OFFICE
CERTIFICATE OF CORRECTION

PATENT NO. : 7,927,970 B2  
APPLICATION NO. : 12/369485  
DATED : April 19, 2011  
INVENTOR(S) : Jeffrey Scott Cites et al.

It is certified that error appears in the above-identified patent and that said Letters Patent is hereby corrected as shown below:

In the Specifications

| No. | Col. | Line | Description |
|---|---|---|---|
| 1 | 4 | 8 | Please delete "$H_2^+$" and add --$H_2D^+$-- |
| 2 | 19 | 52 | Please delete "$Na^{-1}$" and add --$Na^{+1}$-- |
| 3 | 29 | 16 | Please delete "meter" and add --$meter^2$-- |

Signed and Sealed this  
Twenty-first Day of May, 2013

Teresa Stanek Rea  
*Acting Director of the United States Patent and Trademark Office*